(12) United States Patent
Chang et al.

(10) Patent No.: US 11,984,469 B2
(45) Date of Patent: May 14, 2024

(54) DISPLAY DEVICE

(71) Applicant: LG ELECTRONICS INC., Seoul (KR)

(72) Inventors: Myungwhun Chang, Seoul (KR); Yanghyun Kim, Seoul (KR); Jonghwa Won, Seoul (KR); Donghyun Kim, Seoul (KR); Jonggon Shin, Seoul (KR); Jongjin Woo, Seoul (KR); Kimun Paik, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 380 days.

(21) Appl. No.: 17/323,734

(22) Filed: May 18, 2021

(65) Prior Publication Data

US 2022/0077226 A1    Mar. 10, 2022

(30) Foreign Application Priority Data

Sep. 4, 2020    (WO) ................ PCT/KR2020/011922

(51) Int. Cl.
*H01L 27/15*    (2006.01)
*H01L 33/38*    (2010.01)
*H01L 33/62*    (2010.01)

(52) U.S. Cl.
CPC .......... *H01L 27/156* (2013.01); *H01L 33/382* (2013.01); *H01L 33/62* (2013.01)

(58) Field of Classification Search
CPC ..... H01L 27/156; H01L 33/382; H01L 33/62; H01L 33/44; H01L 25/0753; H01L 27/12; H01L 33/48; H01L 33/52; H01L 33/56; G09F 9/33
See application file for complete search history.

(56) References Cited

U.S. PATENT DOCUMENTS

| 2015/0189703 A1* | 7/2015 | Akazawa ............. H01L 33/508 313/503 |
| 2016/0027977 A1* | 1/2016 | Seo ........................ H01L 33/62 257/98 |
| 2020/0105184 A1 | 4/2020 | Shao et al. |

FOREIGN PATENT DOCUMENTS

| KR | 1020110056819 | 5/2011 |
| KR | 1020130002848 | 1/2013 |
| KR | 1020130143308 | 12/2013 |
| WO | 2020050652 | 3/2020 |

OTHER PUBLICATIONS

PCT International Application No. PCT/KR2020/011922, International Search Report dated Jun. 1, 2021, 9 pages.

* cited by examiner

*Primary Examiner* — Su C Kim
(74) *Attorney, Agent, or Firm* — LEE, HONG, DEGERMAN, KANG & WAIMEY

(57) ABSTRACT

A display device includes a base substrate having an electrode pad on a front surface thereof, a light emitting device provided on the base substrate and connected to the electrode pad, a first molding configured to cover at least a part of the electrode pad by avoiding an area in which the light emitting device is provided, and a second molding configured to cover the light emitting device and the first molding.

11 Claims, 21 Drawing Sheets

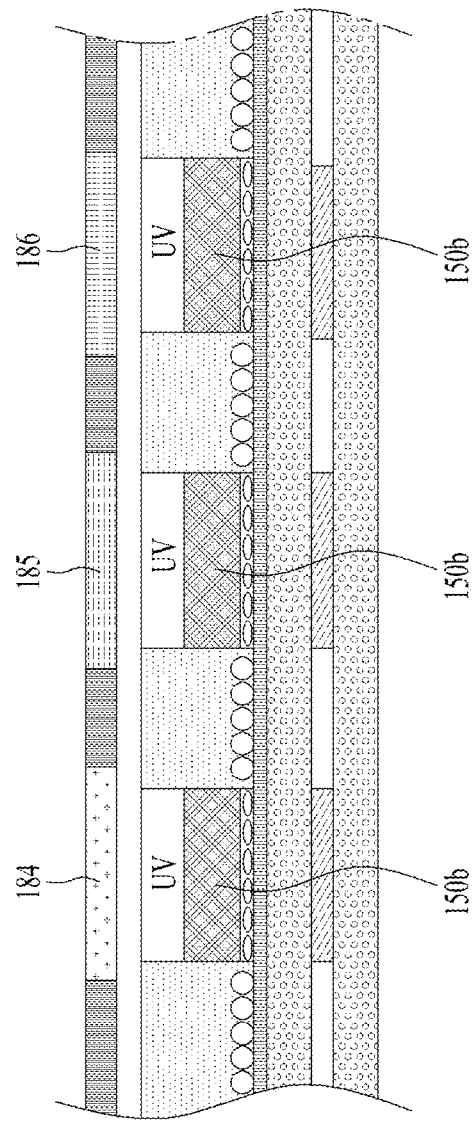

DISPLAY DEVICE

CROSS-REFERENCE TO RELATED APPLICATIONS

Pursuant to 35 U.S.C. § 119 (a), this application claims the benefit of an earlier filing date and right of priority to International Application No. PCT/KR2020/011922 filed on Sep. 4, 2020, the contents of which is hereby incorporated by reference herein in its entirety.

BACKGROUND OF THE DISCLOSURE

Field of the Disclosure

The present disclosure relates to a display device and, more particularly, to a display device including a semiconductor light emitting device, which is applicable to a technical field for improving a contrast ratio.

Background of the Disclosure

The contrast ratio of a display is a ratio between the maximum and minimum brightness of the display. If a display has a contrast ratio of 10000:1, it means that the maximum brightness is 10000 times the minimum brightness and the display can identify up to 10000 levels of contrast between the brightest and darkest colors. The higher the contrast ratio of the display is, the better the image quality thereof may be obtained.

Expression of complete black on displays is important in improving the contrast ratio. The better the quality of black color, the higher the contrast ratio that can be implemented at relatively low luminance levels. However, in this case, an electrode pad connected to a light emitting diode (LED) may lower the contrast ratio.

Specifically, the LED is connected to the electrode pad provided on a base substrate and emits light in response to an applied electrical signal. Considering that the electrode pad provided on the base substrate may be made of metal and reflect light, the light reflected by the electrode pad may decrease the contrast ratio of the display device.

This problem may be more pronounced when the LED is connected to the electrode pad through a wire. The reason for this is that the electrode pad connected to the LED through the wire is exposed to the front surface.

In the prior art, a molding with predetermined opacity has been stacked over the entirety of the display to decrease the contrast ratio. However, in this case, since the light emitted from the LED is also blocked, the opacity is limited. Further, it may also be problematic that high power is required to drive the LED.

SUMMARY OF THE DISCLOSURE

Accordingly, the present disclosure is directed to a display device that substantially obviates one or more problems due to limitations and disadvantages of the related art.

An object of the present disclosure is to improve the contrast ratio of a display device.

Another object of the present disclosure is to solve various problems not mentioned herein. It will be appreciated by persons skilled in the art that the objects that could be achieved with the present disclosure are not limited to what has been particularly described hereinabove and the above and other objects that the present disclosure could achieve will be more clearly understood from the following description and drawings.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device may include a base substrate having an electrode pad on a front surface thereof, a light emitting device provided on the base substrate and connected to the electrode pad, a first molding configured to cover at least a part of the electrode pad by avoiding an area in which the light emitting device is provided, and a second molding configured to cover the light emitting device and the first molding.

The electrode pad may include a first electrode pad connected to a first electrode of the light emitting device and a second electrode pad connected to a second electrode of the light emitting device. In this case, the first molding may be configured to cover at least one of the first electrode pad and the second electrode pad.

The light emitting device may include a vertical type light emitting device provided on the first electrode pad and wired to the second electrode pad. In this case, the first molding may be configured to cover the second electrode pad connected to the vertical type light emitting device.

The light emitting device may include a horizontal type light emitting device wired to the first electrode pad and the second electrode pad. In this case, the first molding may be configured to cover the first electrode pad and the second electrode pad connected to the horizontal type light emitting device.

A plurality of light emitting devices may be arranged on the first electrode pad and wired to a plurality of second electrode pads adjacent thereto, respectively. In this case, the first molding may be configured to cover the plurality of second electrode pads provided adjacent to the first electrode pad.

The plurality of light emitting devices may include a vertical type light emitting device and a horizontal type light emitting device. The first electrode pad may include a contact portion to be wired to the horizontal type light emitting device, wherein the contact portion may extend in one direction in an area in which the light emitting devices are provided. In this case, the first molding may be configured to cover the contact portion of the first electrode pad.

The electrode pad and the plurality of light emitting devices may be provided for each pixel unit. The second electrode pad provided in one pixel unit may be positioned to be closer to the second electrode pad in another adjacent pixel unit than the first electrode pad in the corresponding pixel unit.

The light emitting device may include a vertical type light emitting device and a horizontal type light emitting device. The first electrode pad may include an unexposed first electrode pad overlapping with the vertical type light emitting device and connected to a first electrode of the vertical type light emitting device, and an exposed first electrode pad provided by avoiding an area in which the light emitting device is provided and connected to a first electrode of the horizontal type light emitting device. In this case, the first molding may be configured to cover the exposed first electrode pad and one or more second electrode pads, each of which is wired to the light emitting device.

The vertical type light emitting device may be fixed to the unexposed first electrode pad by a first adhesive, and the horizontal type light emitting device may be fixed to the base substrate by a second adhesive. In this case, opacity of the first adhesive may be higher than opacity of the second adhesive.

The display device may further include a support member provided on the base substrate, overlapping with the horizontal type light emitting device, and having a thickness corresponding to the unexposed first electrode pad.

The first molding may be more opaque than the second molding.

The first molding may have a front surface forming a step difference with a front surface of the light emitting device. In this case, the front surface of the first molding may be positioned lower than the front surface of the light emitting device.

The first molding may be made of silicon. The first molding may contain a predetermined amount of black powder determining viscosity and brightness of the first molding.

The predetermined amount may be a maximum amount forming a highest point lower than the light emitting device when the first molding is injected into the electrode pad.

The second molding may contain a less amount of black powder than the first molding.

According to the present disclosure, the contrast ratio of the display device may be improved.

It will be appreciated by persons skilled in the art that the effects that can be achieved with the present disclosure are not limited to what has been particularly described hereinabove and other advantages of the present disclosure will be more clearly understood from the following description and drawings.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 5A to 5C are conceptual views illustrating various examples of color implementation in the flip-chip type semiconductor light emitting device;

DETAILED DESCRIPTION OF THE PREFERRED EMBODIMENTS

Hereinafter, embodiments of the disclosure will be described in detail with reference to the attached drawings. The same or similar components are given the same reference numbers and redundant description thereof is omitted. The suffixes "module" and "unit" of elements herein are used for convenience of description and thus may be used interchangeably and do not have any distinguishable meanings or functions. Further, in the following description, if a detailed description of known techniques associated with the present disclosure would unnecessarily obscure the gist of the present disclosure, detailed description thereof will be omitted. In addition, the attached drawings are provided for easy understanding of embodiments of the disclosure and do not limit technical spirits of the disclosure.

Although the drawings are separately described for convenience of description, it is also within the scope of the present disclosure for those skilled in the art to combine at least two or more drawings to implement other embodiments.

When an element such as a layer, region or substrate is referred to as being "on" another element, it may be interpreted to mean that the element is directly on the other element or an intermediate element is present between the elements.

A display device described in this document is a concept including all display devices that display information based on a pixel unit or a set of pixel units. Therefore, the present disclosure is also applicable to parts without being limited to finished products. For example, a panel corresponding to a part of a digital TV corresponds to the display device in the present specification. Finished products include mobile phones, smart phones, laptop computers, digital broadcasting terminals, personal digital assistants (PDAs), portable multimedia players (PMPs), navigators, slate PCs, tablet PCs, ultra-books, digital TVs, and desktop computers.

However, it will be apparent to those skilled in the art that the configurations according to embodiments described in this document are applicable to devices capable of displaying including even a new product to be developed.

In addition, a semiconductor light emitting device described herein is a concept including a light emitting diodes (LED), a micro LED, etc., and the terms are used interchangeably.

Figure 1:
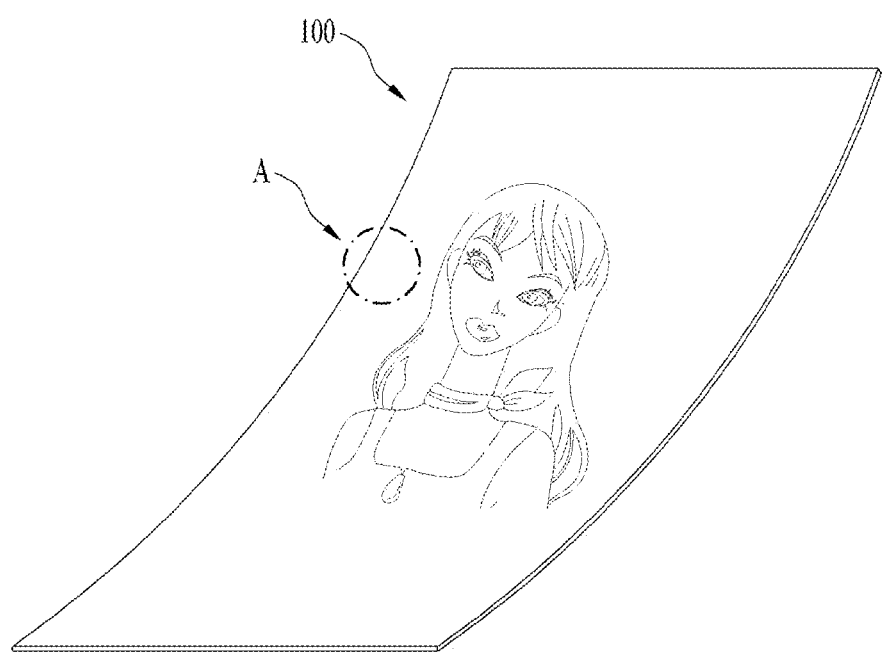
FIG. 1 is a conceptual view illustrating an embodiment of a display device using semiconductor light emitting devices according to the present disclosure.

FIG. 1 is a conceptual view illustrating an embodiment of a display device using semiconductor light emitting devices according to the present disclosure.

As shown in FIG. 1, information processed by a controller (not shown) of the display device 100 may be displayed on a flexible display.

The flexible display may include displays that are bendable, twistable, foldable, and rollable by external forces.

Further, the flexible display may mean a display manufactured on a thin and flexible substrate that can be bent, folded, or rolled like paper while maintaining the display characteristics of a conventional flat panel display.

When the flexible display is not bent (for example, a state having an infinite radius of curvature) (hereinafter referred to as a first state), the display area of the flexible display may be a flat surface. When the flexible display is bent by an external force from the first state (for example, a state having a finite radius of curvature) (hereinafter referred to as a second state), the display area may be a curved surface. Referring to FIG. 1, information displayed in the second state may be visual information output on the curved surface. Such visual information is implemented by independently controlling light emission of pixel units (sub-pixels) arranged in a matrix form. The pixel unit refers to, for example, a minimum unit for implementing one color.

The pixel unit of the flexible display may be implemented with a semiconductor light emitting device. In the present disclosure, a light emitting diode (LED) is exemplified as a kind of semiconductor light emitting device that converts current into light. The LED is formed in a small size, and thus, it may serve as the pixel unit even in the second state.

The flexible display implemented with the LED will be described in detail below with reference to the accompanying drawings.

Figure 2:
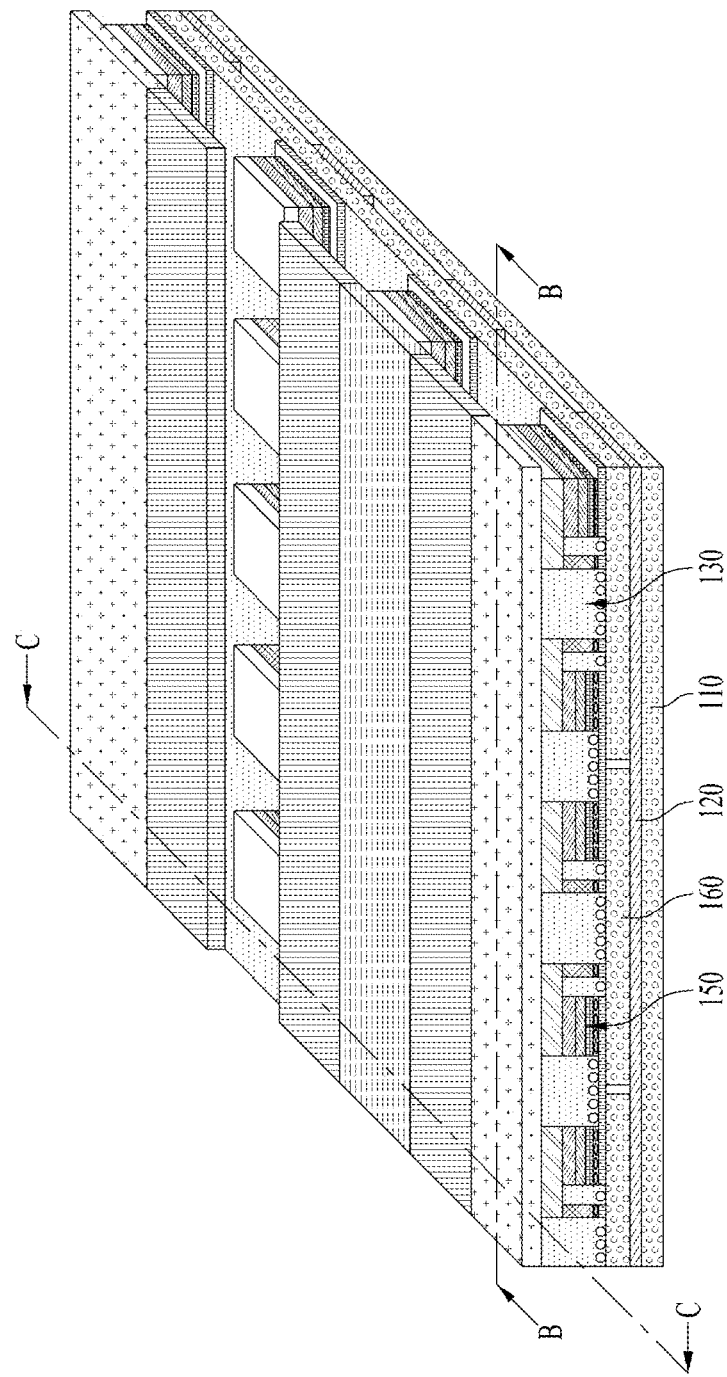
FIG. 2 is a partially enlarged view of portion A of FIG. 1.

FIG. 2 is a partially enlarged view of portion A of FIG. 1.

Figure 3A:
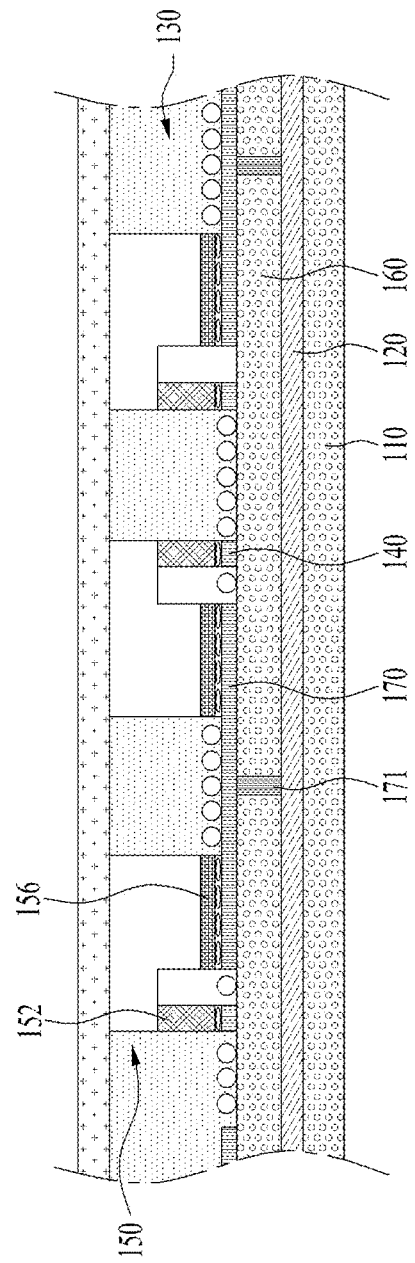
FIGS. 3A and 3B are cross-sectional views taken along lines B-B and C-C of FIG. 2.
Figure 3B:
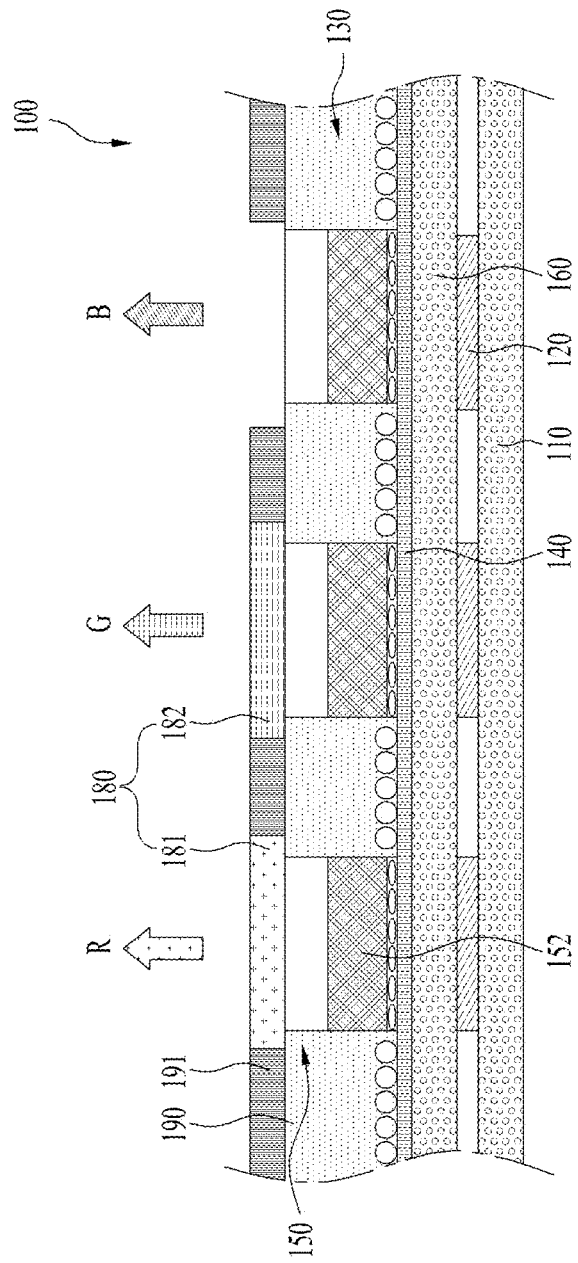

FIGS. 3A and 3B are cross-sectional views taken along lines B-B and C-C of FIG. 2.

Figure 4:
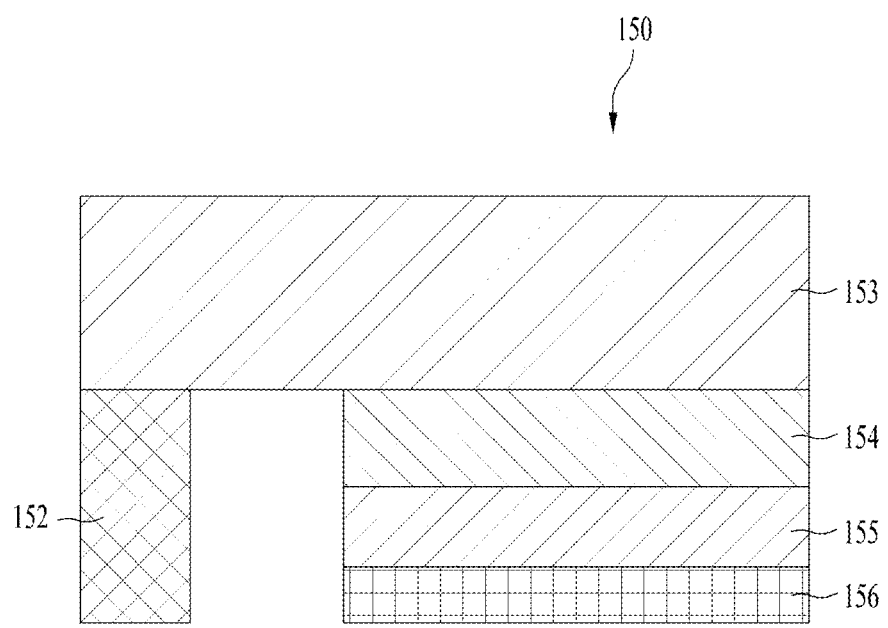
FIG. 4 is a conceptual view illustrating a flip-chip type semiconductor light emitting device of FIG. 3.

FIG. 4 is a conceptual view illustrating a flip-chip type semiconductor light emitting device of FIG. 3.

Figure 5A:
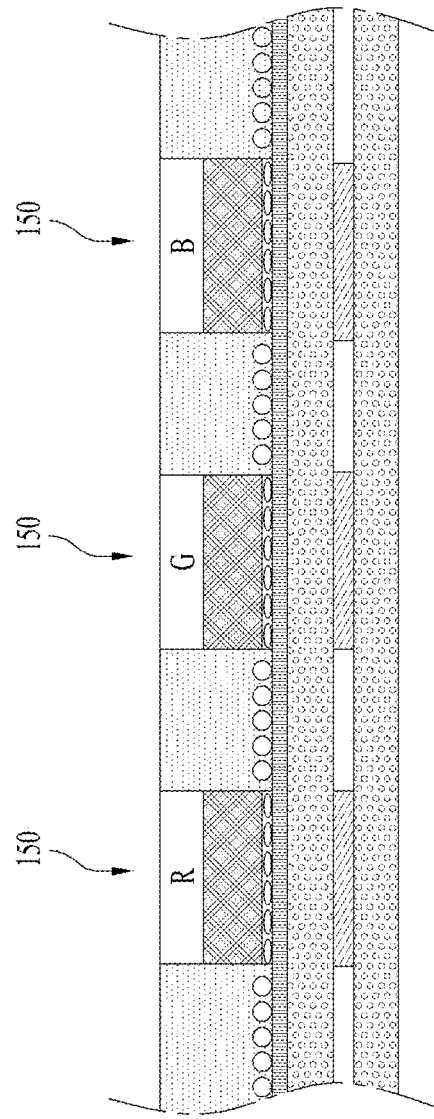
Figure 5B:
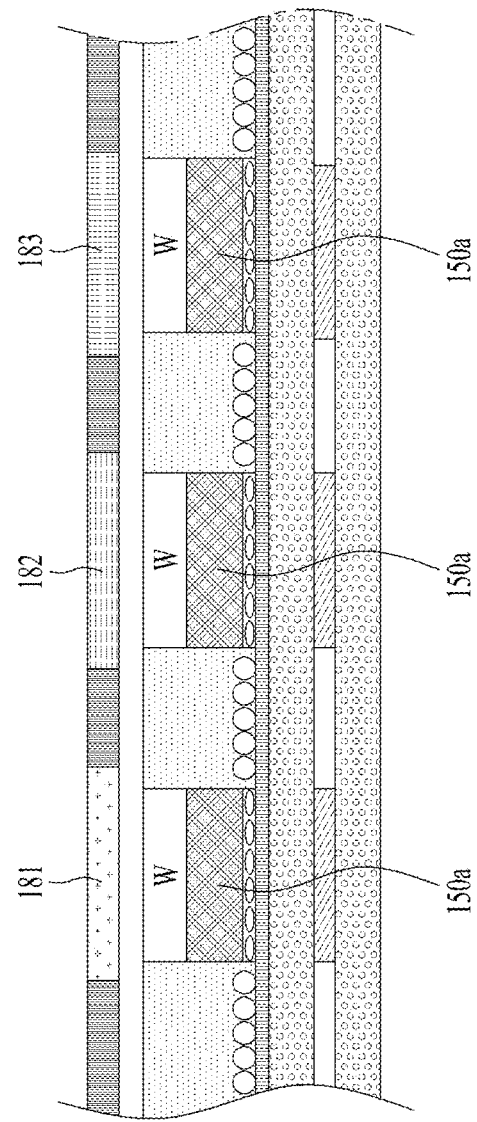

FIG. 5A to 5C are conceptual views illustrating various examples of color implementation in the flip-chip type semiconductor light emitting device.

In FIGS. 2, 3A, and 3B, a display device 100 using passive matrix (PM) type semiconductor light emitting devices is illustrated as the display device 100 using semiconductor light emitting devices. However, the following examples are applicable to an active matrix (AM) type semiconductor light emitting device.

The display device 100 illustrated in FIG. 1 may include a substrate 110, a first electrode 120, a conductive adhesive layer 130, a second electrode 140, and at least one semiconductor light emitting device 150 as shown in FIG. 2.

The substrate 110 may be a flexible substrate. For example, the substrate 110 may include glass or polyimide (PI) to implement a flexible display device. In addition, any insulating and flexible material such as polyethylene naphthalate (PEN) and polyethylene terephthalate (PET) may be used. In addition, the substrate 110 may be made of a transparent or opaque material.

The substrate 110 may be a wiring board on which the first electrode 120 is disposed, and thus the first electrode 120 may be positioned on the substrate 110.

As shown in FIG. 3A, an insulating layer 160 may be disposed on the substrate 110 on which the first electrode 120 is located, and an auxiliary electrode 170 may be located on the insulating layer 160. In this case, a state in which the insulating layer 160 is stacked on the substrate 110 may be regarded as one wiring board. Specifically, the insulating layer 160 is made of an insulating and flexible material such as PI, PET, and PEN. Further, the insulating layer 160 may be integrated with the substrate 110 to form a single substrate.

The auxiliary electrode 170 may be an electrode that electrically connects the first electrode 120 and the semiconductor light emitting device 150. The auxiliary electrode 170 is positioned on the insulating layer 160 and is disposed at a position corresponding to that of the first electrode 120. For example, the auxiliary electrode 170 has a dot shape and may be electrically connected to the first electrode 120 by an electrode hole 171 penetrating the insulating layer 160. The electrode hole 171 may be formed by filling a via hole with a conductive material.

While the conductive adhesive layer 130 is formed on one surface of the insulating layer 160 as shown in FIG. 2 or 3A, the present disclosure is not limited thereto. For example, a layer performing a specific function may be formed between the insulating layer 160 and the conductive adhesive layer 130, or the conductive adhesive layer 130 may be disposed on the substrate 110 without the insulating layer 160. When the conductive adhesive layer 130 is disposed on the substrate 110, the conductive adhesive layer 130 may serve as an insulating layer.

The conductive adhesive layer 130 may be a layer having adhesiveness and conductivity. To this end, the conductive adhesive layer 130 may be mixed with conductive and adhesive materials. In addition, the conductive adhesive layer 130 has ductility, thereby providing flexibility with the display device.

For example, the conductive adhesive layer 130 may be an anisotropic conductive film (ACF), an anisotropic conductive paste, a solution containing conductive particles, etc. The conductive adhesive layer 130 may be implemented as a layer that allows electrical interconnection in the Z direction (cross thickness direction) but has electrical insulation in the horizontal X-Y direction. Therefore, the conductive adhesive layer 130 may be referred to as a Z-axis conductive layer (herein, referred to as "conductive adhesive layer").

The ACF is a film obtained by mixing an anisotropic conductive medium with an insulating base member. When heat and pressure are applied, only a specific portion becomes conductive due to the anisotropic conductive medium. Hereinafter, it is described that heat and pressure are applied to the ACF, but other methods may be applied in order for the ACF to have partial conductivity. Here, the other methods may include, for example, application of either heat or pressure, ultraviolet (UV) hardening, and so on.

In addition, the anisotropic conductive medium may be, for example, conductive balls or conductive particles. For example, the ACF is a film in which conductive balls are mixed with an insulating base member. When heat and pressure are applied, only a specific portion becomes conductive due to the conductive balls. The ACF may contain a plurality of particles, each of which is obtained by coating a core conductive material with an insulating film made of a polymer material. In this case, the insulating film of a portion to which heat and pressure are applied may be destroyed, and thus the ACF becomes conductive due to the core. The shape of the core may change so that layers in contact with each other form in the thickness direction of the film. For example, heat and pressure may be uniformly applied to the ACF, and electrical connection in the Z direction may be formed partially due to a height difference between counterparts adhered to the ACF.

As another example, the ACF may contain a plurality of particles, each of which is obtained by coating an insulating core with a conductive material. In this case, the conductive material of a portion to which heat and pressure are applied may be deformed (pressed), and thus the ACF has conductivity in the thickness direction of the film. In a further example, a conductive material penetrates an insulating base member in the Z direction so that the ACF has conductivity in the thickness direction of the film. In this case, the conductive material may have a pointed end.

The ACF may be a fixed-array ACF where conductive balls are inserted into one surface of an insulating base member. Specifically, the insulating base member is made of an adhesive material, and the conductive balls are intensively disposed on the bottom of the insulating base member. When heat and pressure are applied to the base member, the conductive balls may be deformed, and thus, the ACF may have conductivity in the vertical direction.

However, the present disclosure is not limited thereto. That is, the ACF may be formed by randomly mixing and inserting conductive balls into an insulating base member. Alternatively, the ACF may be formed in multiple layers, and conductive balls may be arranged in any one layer (double-ACF).

The anisotropic conductive paste may be obtained by combining conductive balls with a paste. Specifically, the anisotropic conductive paste may be a paste in which conductive balls are mixed with an insulating and adhesive base material. In addition, the solution containing conductive particles may be a solution containing conductive particles or nanoparticles.

Referring again to FIG. 3A, the second electrode 140 may be spaced apart from the auxiliary electrode 170 and positioned on the insulating layer 160. That is, the conductive adhesive layer 130 may be disposed on the insulating layer 160 on which the auxiliary electrode 170 and the second electrode 140 are located.

After forming the conductive adhesive layer 130 while the auxiliary electrode 170 and the second electrode 140 are positioned on the insulating layer 160, the semiconductor light emitting device 150 may be connected in the form of a flip chip by applying heat and pressure so that the semiconductor light emitting device 150 may be electrically connected to the first electrode 120 and the second electrode 140.

Referring to FIG. 4, the semiconductor light emitting device 150 may be a flip-chip type light emitting device.

For example, the semiconductor light emitting device may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 disposed horizontally apart from the p-type electrode 156 on the n-type semiconductor layer 153. In this case, the p-type electrode 156 may be electrically connected to the auxiliary electrode 170 and the conductive adhesive layer 130 shown in FIG. 3, and the n-type electrode 152 may be electrically connected to the second electrode 140.

Referring again to FIGS. 2, 3A, and 3B, the auxiliary electrode 170 may be elongated in one direction such that one auxiliary electrode 170 is electrically connected to a plurality of semiconductor light emitting devices 150. For example, the p-type electrodes of left and right semiconductor light emitting devices around the auxiliary electrode 170 may be electrically connected to one auxiliary electrode.

Specifically, the semiconductor light emitting device 150 may be pressed into the inside of the conductive adhesive layer 130 by heat and pressure. As a result, only a part between the auxiliary electrode 170 and the p-type electrode 156 of the semiconductor light emitting device 150 and a part between the second electrode 140 and the n-type electrode 152 of the semiconductor light emitting device 150 may become conductive. In addition, the remaining parts has no conductivity because the semiconductor light emitting device 150 is not pressed thereinto. In this way, the conductive adhesive layer 130 not only interconnects the semiconductor light emitting device 150 with the auxiliary electrode 170 and the second electrode 140, but also forms electrical connection therebetween.

Further, the plurality of semiconductor light emitting devices 150 constitute an array of light emitting devices, and a phosphor layer 180 may be formed in the light emitting device array.

The light emitting device array may include a plurality of semiconductor light emitting devices 150 having different luminance values. Each semiconductor light emitting device 150 corresponds to a pixel unit and is electrically connected to the first electrode 120. For example, there may be a plurality of first electrodes 120, and semiconductor light emitting devices 150 may be arranged in multiple rows. In this case, semiconductor light emitting devices 150 in each row may be electrically connected to any one of the plurality of first electrodes.

Since semiconductor light emitting devices 150 are connected in the form of a flip chip, the semiconductor light emitting devices 150 may be grown on a transparent dielectric substrate. Further, the semiconductor light emitting devices 150 may be, for example, nitride semiconductor light emitting devices. Since the semiconductor light emitting device 150 has excellent luminance, each pixel unit may be configured with a small size.

As shown in FIG. 3, a partition wall 190 may be formed between semiconductor light emitting devices 150. In this case, the partition wall 190 may serve to separate individual pixel units from each other and be integrated with the conductive adhesive layer 130. For example, when the semiconductor light emitting device 150 is inserted into the ACF, the base member of the ACF may act as the partition wall 190.

In addition, when the base member of the ACF is black, even if there is no separate black insulator, the partition wall 190 may have reflective properties, and at the same time, the contrast ratio may increase.

In another example, a reflective partition wall may be separately provided as the partition wall 190. In this case, the partition wall 190 may include a black or white insulator depending on the purpose of the display device. When the partition wall 190 includes a white insulator, reflectivity may increase. When the partition wall 190 includes a black insulator, the contrast may increase while the partition wall 190 has reflective properties.

The phosphor layer 180 may be positioned on the outer surface of the semiconductor light emitting device 150. For example, the semiconductor light emitting device 150 may be a blue semiconductor light emitting device that emits blue (B) light, and the phosphor layer 180 may serve to convert the blue (B) light into a pixel unit color. The phosphor layer 180 may be a red phosphor 181 or a green phosphor 182, which constitutes each pixel.

That is, the red phosphor 181 capable of converting blue light into red (R) light may be stacked at a position corresponding to a red pixel unit on the blue semiconductor light emitting device, and the green phosphor 182 capable of converting blue light into green (G) light may be stacked at a position corresponding to a green pixel unit on the blue semiconductor light emitting device. The blue semiconductor light emitting device may be used alone at a position corresponding to a blue pixel unit. In this case, red (R), green (G), and blue (B) pixel units may form one pixel. Specifically, phosphors having the same color may be stacked along each line of the first electrode 120. Accordingly, one line of the first electrode 120 may be an electrode that controls one color. That is, red (R), green (G), and blue (B) may be sequentially disposed along the second electrode 140 to implement the pixel unit.

However, the present disclosure is not limited thereto. To implement the red (R), green (G), and blue (B) pixel units, the semiconductor light emitting device 150 may be combined with a quantum dot (QD) rather than a phosphor.

A black matrix 191 may be disposed between phosphor layers to improve contrast. That is, the black matrix 191 may improve the contrast of light and dark.

However, the present disclosure is not limited thereto, and other structures for implementing blue, red, and green colors may also be applied.

Referring to FIG. 5A, each semiconductor light emitting device 150 may be implemented as a high-power light-emitting device capable of emitting various light including blue light by using gallium nitride (GaN) as a main material and adding indium (In) and/or aluminum (Al).

In this case, the semiconductor light emitting device 150 may correspond to a red, green, or blue semiconductor light emitting device for forming each pixel unit. For example, red (R), green (G), and blue (B) semiconductor light emitting devices may be alternately arranged, and the red, green, and blue pixel units may form one pixel. That is, the red, green, and blue semiconductor light emitting devices may implement a full color display.

Referring to FIG. 5B, a semiconductor light emitting device 150*a* may include a white light emitting device W in which a yellow phosphor layer is provided for each individual device. In this case, to form the pixel unit, a red phosphor layer 181, a green phosphor layer 182, and a blue phosphor layer 183 may be provided on the white light emitting device W. In addition, the pixel unit may be formed on the white light emitting device W by using a color filter in which red, green, and blue are repeated.

Referring to FIG. 5C, a red phosphor layer 184, a green phosphor layer 185, and a blue phosphor layer 186 may be provided on an ultraviolet light emitting device 150*b*. In this way, the semiconductor light emitting device 150 may be used in the entire range of not only visible light but also UV light. Further, the semiconductor light emitting device 150 may be extended to such a level that UV light is used as the excitation source of an upper phosphor.

Looking again at this example, the semiconductor light emitting device 150 may be positioned on the conductive adhesive layer 130 to form the pixel unit in the display device. Since the semiconductor light emitting device 150 has excellent luminance, each pixel unit may be configured with a small size.

Each semiconductor light emitting device 150 may be a rectangular or square device and have, for example, one side length of 80 μm or less. In the case of a rectangle, the size of semiconductor light emitting device 150 may be 20 by 80 μm$^2$ or less.

Even when a square semiconductor light emitting device 150 with one side length of 10 μm is used as the pixel unit, sufficient brightness for the display device may be obtained.

In the case of a rectangular pixel unit having one side of 600 μm and the other side of 300 μm, the semiconductor light emitting devices may be spaced sufficiently apart.

Therefore, in this case, a flexible display device having a quality higher than high definition (HD) quality may be implemented.

The above-described display device using semiconductor light emitting devices may be manufactured by a new manufacturing method. Hereinafter, the manufacturing method will be described with reference to FIG. 6.

Figure 6:
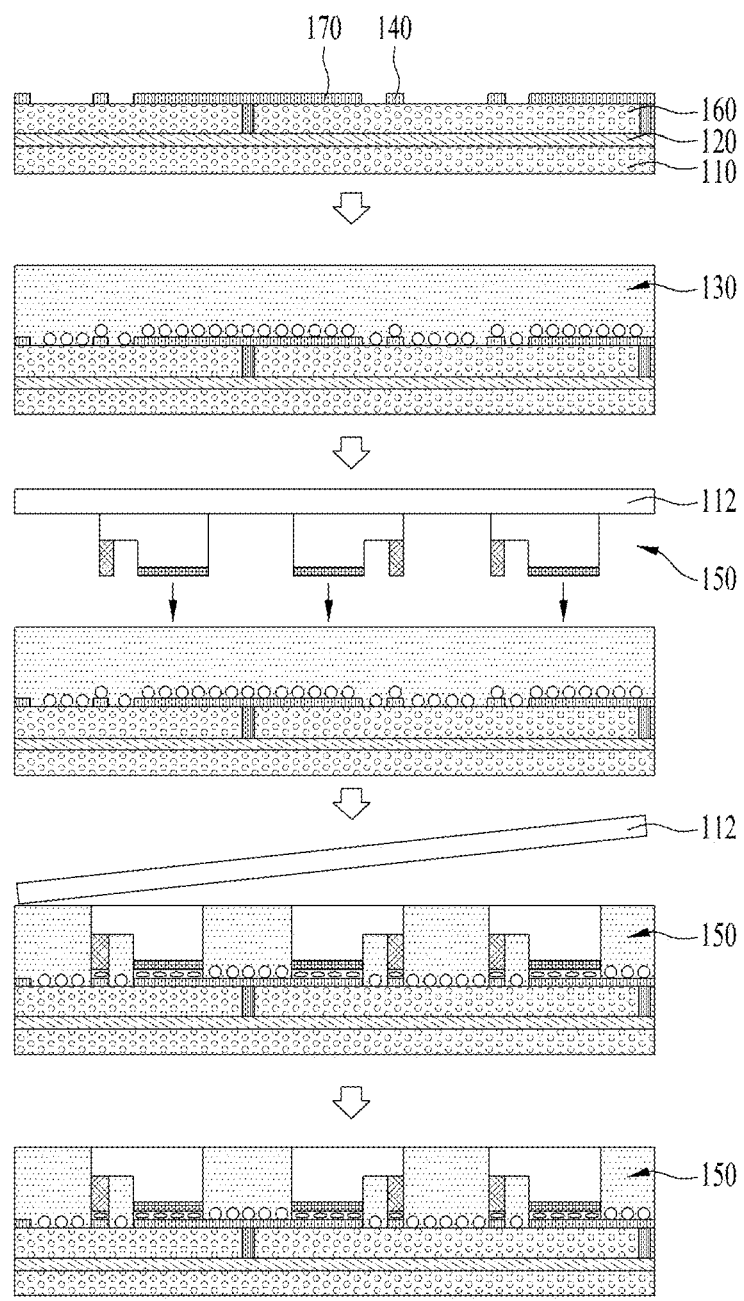
FIG. 6 is cross-sectional views for explaining a method of manufacturing the display device using semiconductor light emitting devices according to the present disclosure.

FIG. 6 is cross-sectional views for explaining a method of manufacturing the display device using semiconductor light emitting devices according to the present disclosure.

Referring to FIG. 6, the conductive adhesive layer 130 is formed on the insulating layer 160 on which the auxiliary electrode 170 and the second electrode 140 are located. The insulating layer 160 is stacked on the wiring board 110, and the first electrode 120, the auxiliary electrode 170, and the second electrode 140 are disposed on the wiring board 110. In this case, the first electrode 120 and the second electrode 140 may be disposed in a direction orthogonal to each other. In addition, to implement a flexible display device, each of the wiring board 110 and the insulating layer 160 may include glass or PI.

The conductive adhesive layer 130 may be implemented with, for example, an ACF, and to this end, the ACF may be applied to a substrate on which the insulating layer 160 is positioned.

A plurality of semiconductor light emitting devices 150, which constitute each pixel and correspond to the positions of the auxiliary electrodes 170 and the second electrodes 140, may be located on a temporary substrate 112. The temporary substrate 112 may be disposed such that the semiconductor light emitting device 150 faces the auxiliary electrode 170 and the second electrode 140.

In this case, the temporary substrate 112 may be a growth substrate for growing the semiconductor light emitting device 150, and it may be a spire substrate or a silicon substrate.

If semiconductor light emitting devices are formed on a wafer basis, each semiconductor light emitting device may have a gap and size suitable for forming the display device so that the semiconductor light emitting device may be efficiently used for the display device.

Then, the wiring board 110 and the temporary substrate 112 are thermally compressed. For example, the wiring board 110 and the temporary substrate 112 may be thermally compressed by an ACF press head. The wiring board 110 and the temporary substrate 112 are bonded by the thermal compression. Due to the characteristic of the ACF having conductivity by thermal compression, only parts between the auxiliary electrode 170 and the semiconductor light emitting device 150 and between the second electrode 140 and the semiconductor light emitting device 150 may become conductive. Accordingly, the semiconductor light emitting device 150 may be electrically connected to the electrodes. In this case, the semiconductor light emitting device 150 may be inserted into the inside of the ACF so that a partition wall may be formed between semiconductor light emitting devices 150.

Then, the temporary substrate 112 may be removed. For example, the temporary substrate 112 may be removed by laser lift-off (LLO) or chemical lift-off (CLO).

Finally, the semiconductor light emitting devices 150 may be exposed to the outside by removing out the temporary substrate 112. If necessary, a transparent insulating layer (not shown) may be formed by coating silicon oxide (SiOx)

on the wiring board to which the semiconductor light emitting device 150 is coupled.

In addition, the method may further include forming a phosphor layer on one surface of the semiconductor light emitting device 150. For example, when the semiconductor light emitting device 150 is a blue semiconductor light emitting device that emits blue (B) light, a red or green phosphor for converting the blue (B) light into a pixel unit color may form a layer on one surface of the blue semiconductor light emitting device.

The manufacturing method for the display device using semiconductor light emitting devices and the structure thereof may be modified in various forms. For example, a vertical semiconductor light emitting device may also be applied to the display device described above.

In the following modified examples or embodiments, the same or similar reference numerals are given for the same or similar configurations as the previous examples, and redundant description will be omitted.

Figure 7:
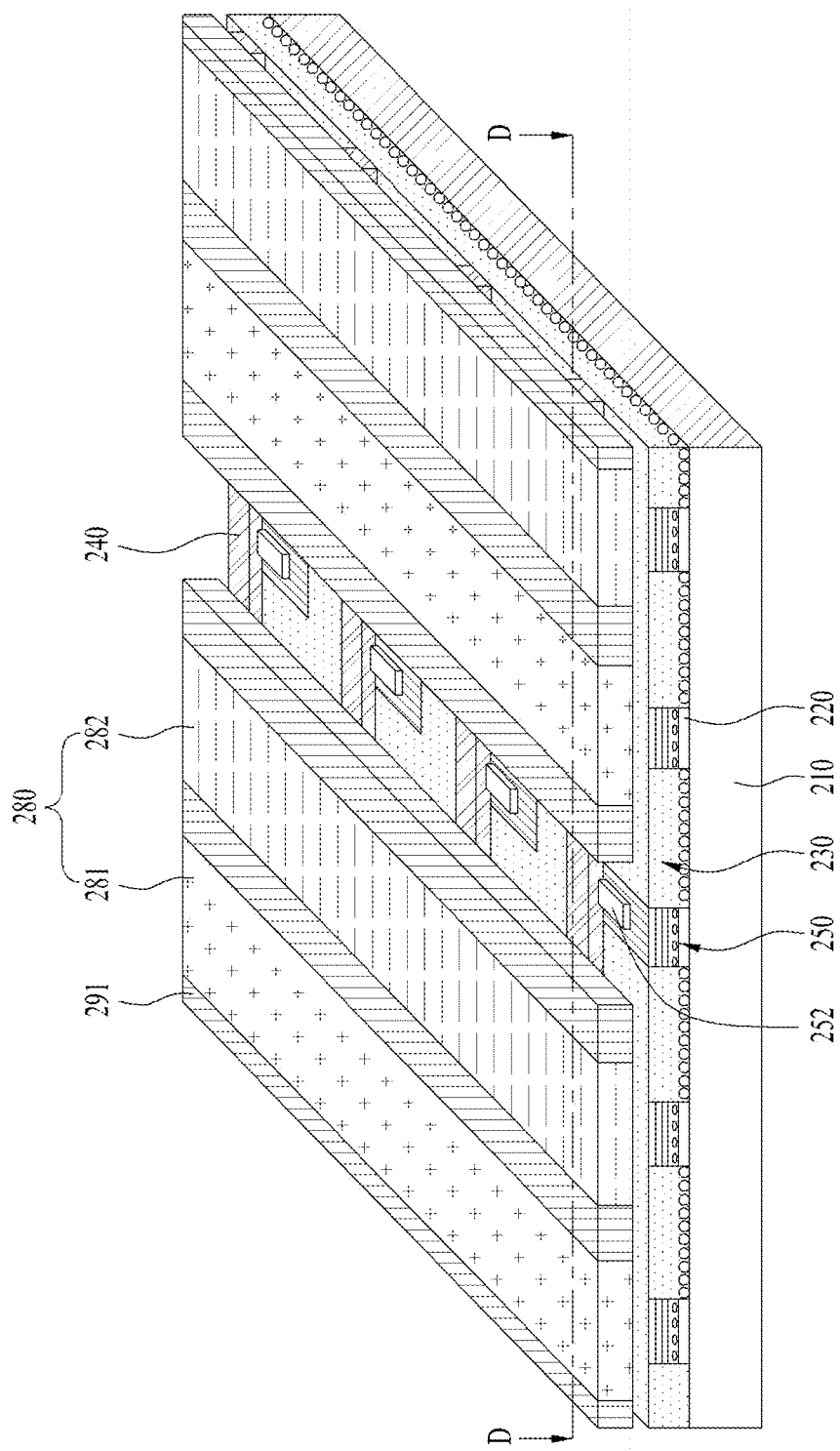
FIG. 7 is a perspective view illustrating another embodiment of the display device using semiconductor light emitting devices according to the present disclosure.
Figure 8:
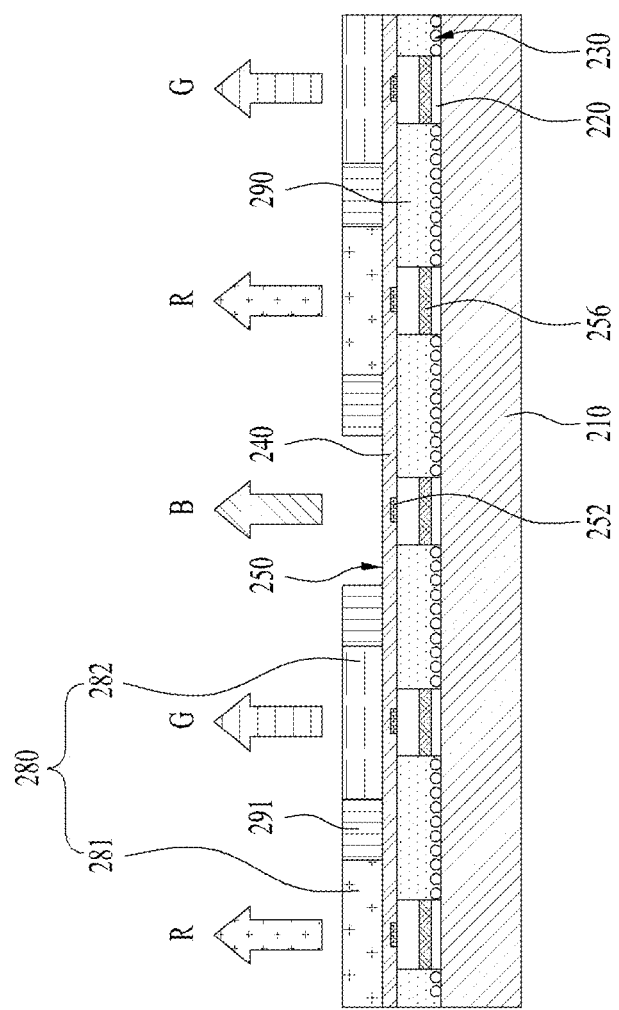
FIG. 8 is a cross-sectional view taken along line D-D of FIG. 7.
Figure 9:
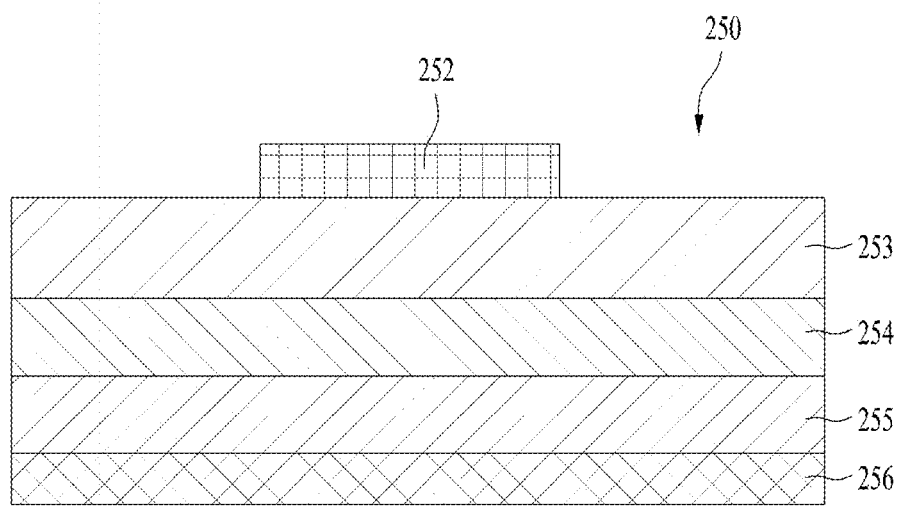
FIG. 9 is a conceptual view illustrating a vertical semiconductor of FIG. 8.

FIG. 7 is a perspective view illustrating another embodiment of the display device using semiconductor light emitting devices according to the present disclosure, FIG. 8 is a cross-sectional view taken along line D-D of FIG. 7, and FIG. 9 is a conceptual view illustrating a vertical semiconductor of FIG. 8.

Referring to the drawings, the display device may be a display device using PM type vertical semiconductor light emitting devices.

The display device includes a substrate 210, a first electrode 220, a conductive adhesive layer 230, a second electrode 240, and at least one semiconductor light emitting device 250.

The substrate 210 is a wiring board on which the first electrode 220 is disposed and may include PI to implement a flexible display device. In addition, any insulating and flexible material may be used.

The first electrode 220 is positioned on the substrate 210 and may be formed in the shape of a bar elongated in one direction. The first electrode 220 may serve as a data electrode.

The conductive adhesive layer 230 is formed on the substrate 210 on which the first electrode 220 is located. Similarly to the display device to which flip-chip type light emitting devices are applied, the conductive adhesive layer 230 may be an ACF, an anisotropic conductive paste, and a solution containing conductive particles. It is assumed in this embodiment that the conductive adhesive layer 230 is implemented as the ACF.

After locating the ACF on the substrate 210 on which the first electrode 220 positioned, the semiconductor light emitting device 250 may be connected by applying heat and pressure. Then, the semiconductor light emitting device 250 may be electrically connected to the first electrode 220. In this case, the semiconductor light emitting device 250 may be preferably disposed on the first electrode 220.

The electrical connection may be established because the ACF partially becomes conductive in the thickness direction after application of the heat and pressure as described above. That is, the ACF may be divided into a non-conductive portion and a conductive portion in the thickness direction.

In addition, since the ACF contains an adhesive component, the conductive adhesive layer 230 implements an electrical connection as well as a mechanical connection between the semiconductor light emitting device 250 and the first electrode 220.

As described above, the semiconductor light emitting device 250 may be positioned on the conductive adhesive layer 230 so that individual pixels are configured in the display device. Since the semiconductor light emitting device 250 has excellent luminance, each pixel unit may be configured with a small size. Each semiconductor light emitting device 250 may be a rectangular or square device and have, for example, one side length of 80 μm or less. In the case of a rectangle, the size of semiconductor light emitting device 250 may be 20 by 80 μm$^2$ or less.

The semiconductor light emitting device 250 may have a vertical structure.

A plurality of second electrodes 240 may be positioned between vertical semiconductor light emitting devices 250. The second electrode 240 may be disposed in a direction traversing the length direction of the first electrode 220 and electrically connected to the vertical semiconductor light emitting device 250.

Referring to FIG. 9, the vertical semiconductor light emitting device 250 may include a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom may be electrically connected to the first electrode 220 through the conductive adhesive layer 230, and the n-type electrode 252 located at the top may be electrically connected to the second electrode 240, which will be described later. The vertical semiconductor light emitting device 250 has an advantage of reducing the chip size because electrodes may be arranged up and down.

Referring again to FIG. 8, a phosphor layer 280 may be formed on one surface of the semiconductor light emitting device 250. For example, if the semiconductor light emitting device 250 is a blue semiconductor light emitting device 251 that emits blue (B) light, a phosphor layer 280 for converting the blue (B) light into a pixel unit color may be provided. In this case, the phosphor layer 280 may include a red phosphor 281 and a green phosphor 282, which constitute each pixel.

That is, the red phosphor 281 capable of converting blue light into red (R) light may be stacked at a position corresponding to a red pixel unit on the blue semiconductor light emitting device, and the green phosphor 182 capable of converting blue light into green (G) light may be stacked at a position corresponding to a green pixel unit on the blue semiconductor light emitting device. The blue semiconductor light emitting device may be used alone at a position corresponding to a blue pixel unit. In this case, red (R), green (G), and blue (B) pixel units may form one pixel.

However, the present disclosure is not limited thereto, and other structures for implementing blue, red, and green colors may be applied to the display device to which flip-chip type light emitting devices are applied as described above.

Referring back to the present embodiment, the second electrode 240 may be positioned between semiconductor light emitting devices 250 and be electrically connected to the semiconductor light emitting devices 250. For example, the semiconductor light emitting devices 250 may be disposed in multiple rows, and the second electrode 240 may be disposed between the rows of the semiconductor light emitting devices 250.

Since the distance between the semiconductor light emitting devices 250 constituting each pixel is sufficiently large, the second electrode 240 may be positioned between the semiconductor light emitting devices 250.

The second electrode 240 may be formed in the shape of a bar elongated in one direction and disposed in a direction perpendicular to the first electrode 220.

In addition, the second electrode 240 and the semiconductor light emitting device 250 may be electrically connected by a connection electrode protruding from the second electrode 240. Specifically, the connection electrode may be the n-type electrode 252 of the semiconductor light emitting device 250. For example, the n-type electrode 252 may be formed as an ohmic electrode for ohmic contact, and the second electrode 240 covers at least a part of the ohmic electrode by printing or evaporation. Thus, the second electrode 240 and the n-type electrode 252 of the semiconductor light emitting device 250 may be electrically connected.

Referring again to FIG. 8, the second electrode 240 may be positioned on the conductive adhesive layer 230. In some cases, a transparent insulating layer (not shown) including SiOx, etc. may be formed on the substrate 210 on which the semiconductor light emitting device 250 is formed. When the second electrode 240 is positioned after formation of the transparent insulating layer, the second electrode 240 may be positioned on the transparent insulating layer. In addition, the second electrode 240 may be formed to be spaced apart from the conductive adhesive layer 230 or the transparent insulating layer.

If a transparent electrode such as Indium Tin Oxide (ITO) is used to position the second electrode 240 on the semiconductor light emitting device 250, there is a problem in that an ITO material has poor adhesion to the n-type semiconductor layer 253. According to the present disclosure, since the second electrode 240 is positioned between the semiconductor light emitting devices 250, transparent electrodes including ITO are not required. Therefore, light extraction efficiency may be improved by using a conductive material having good adhesion to the n-type semiconductor layer 253 as a horizontal electrode without being limited to selection of a transparent material.

Referring again to FIG. 8, a partition wall 290 may be positioned between the semiconductor light emitting devices 250. That is, the partition wall 290 may be disposed between the vertical semiconductor light emitting devices 250 to isolate the semiconductor light emitting devices 250 constituting each pixel. In this case, the partition wall 290 may serve to separate individual pixel units from each other and be integrated with the conductive adhesive layer 230. For example, when the semiconductor light emitting device 250 is inserted into the ACF, the base member of the ACF may form the partition wall 290.

In addition, if the base member of the ACF is black, the partition wall 290 may have reflective properties, and at the same time contrast may increase with no separate black insulator.

In another example, a reflective partition wall may be separately provided as the partition wall 290. The partition wall 290 may include a black or white insulator depending on the usage of the display device.

If the second electrode 240 is directly positioned on the conductive adhesive layer 230 between the semiconductor light emitting devices 250, the partition wall 290 may be located between the vertical semiconductor light emitting device 250 and the second electrode 240. Therefore, each pixel unit may be configured with a small size by the semiconductor light emitting device 250. Thus, the distance between the semiconductor light emitting devices 250 is sufficiently large so that the second electrode 240 may be positioned between the semiconductor light emitting devices 250. Further, a flexible display device having HD image quality may be implemented.

To improve the contrast, a black matrix 291 may be disposed between phosphors as shown in FIG. 8. That is, the black matrix 291 may improve the contrast of light and dark.

Figure 10:
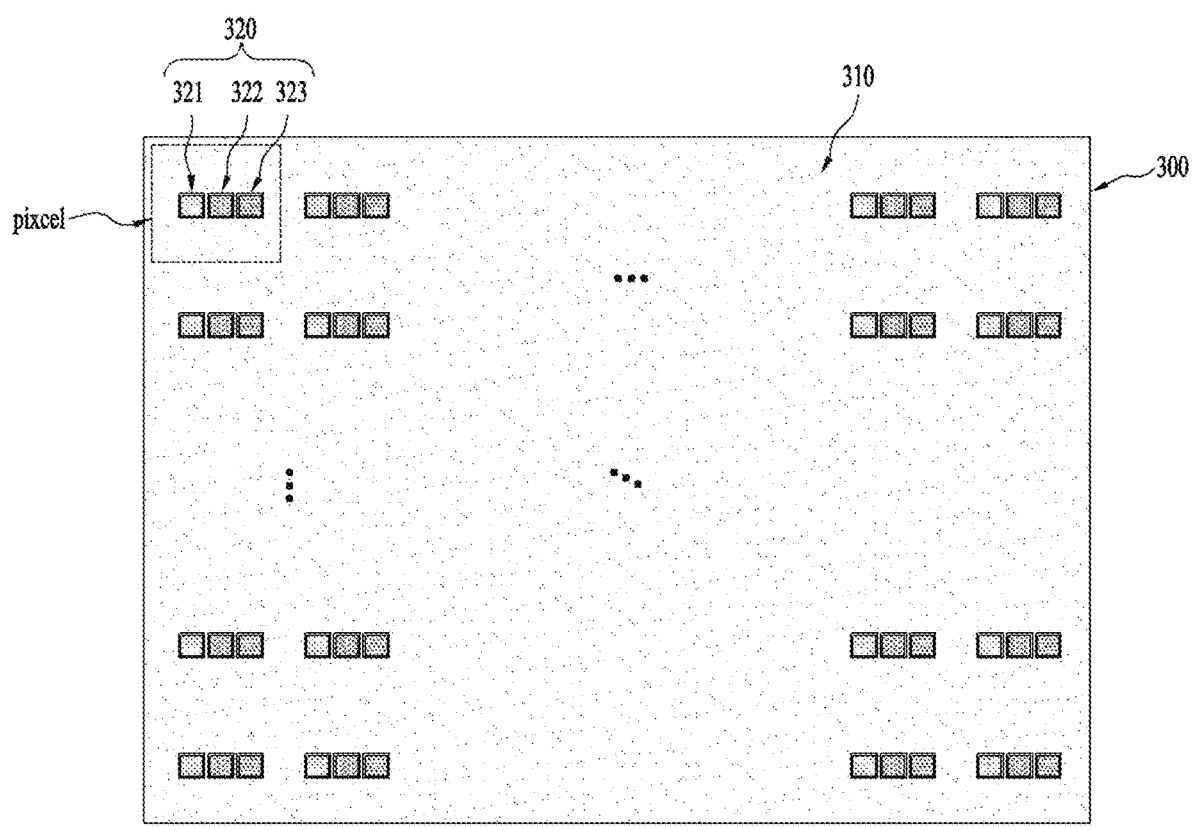
FIG. 10 is a schematic front view of a display device.

FIG. 10 is a schematic front view of a display device.

The display device 300 according to an embodiment of the present disclosure may include a base substrate 310 and a pixel including a plurality of light emitting devices 320 on the base substrate 310.

The base substrate 310 may include circuit wiring for providing a signal to the light emitting device 320. The base substrate 310 may correspond to the substrate 110 shown in FIG. 2. Specifically, the base substrate 310 may include a driving circuit configured to drive the light emitting device 320. The driving circuit may include a PM type driving circuit or an AM type driving circuit.

Figure 11:
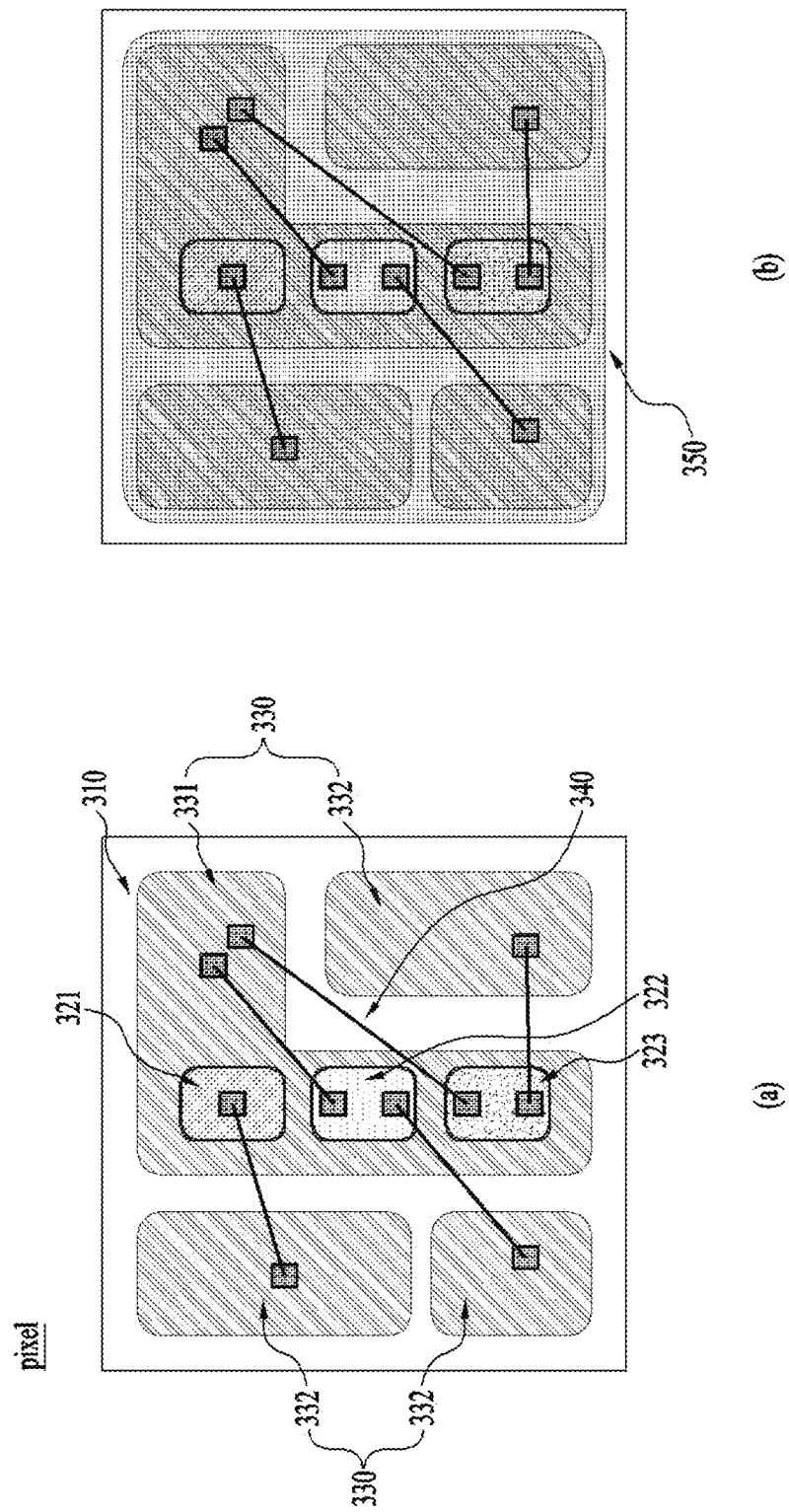
FIG. 11 is an enlarged view of a pixel of FIG. 10.

The base substrate 310 may include an electrode pad 330 connected to light emitting devices 321 to 323 (which are shown in FIG. 11). The electrode pad 330 is provided on the front surface of the base substrate 310 to electrically connect the driving circuit and the light emitting device 320. Specifically, the electrode pad 330 may correspond to the first electrode 120 (more particularly, the auxiliary electrode 170) and the second electrode 140 shown in FIG. 3A.

The pixel may include a red light emitting device 321, a green light emitting device 322, and a blue light emitting device 323 as a picture element. Pixels are provided on the base substrate 310 and may be arranged in columns and rows on the base substrate 310. The pixels may be provided on the base substrate 310 at a predetermined pitch.

Here, the light emitting device 323 may correspond to a semiconductor light emitting device. The light emitting device 323 may be the flip-chip type light emitting device of FIG. 4 or the vertical or horizontal type light emitting device of FIG. 9. In the flip-chip type light emitting device, first and second electrodes may be directly connected to the electrode pad 330 toward the base substrate 310. In the vertical type light emitting device, a first electrode may be directly connected to the electrode pad 330 toward the base substrate 310, but a second electrode may be provided on the front side and connected to the electrode pad 330 through a wire. In the horizontal type light emitting device, first and second electrodes may be provided on the front side and connected to the electrode pads 330 through wires.

When the light emitting device 320 is connected to the electrode pad 330 through a wire, the contrast ratio may decrease because the electrode pad 330 is exposed to the front surface. Hereinafter, this problem will be described in detail.

FIG. 11 is an enlarged view of the pixel of FIG. 10. The same configuration described above in FIG. 10 will not be repeated.

The display device 300 according to an embodiment of the present disclosure may include the base substrate 310 and a pixel including a plurality of light emitting devices 320 on the base substrate 310.

The pixel may correspond to a picture element including the light emitting devices 320 and the electrode pad 330 connected to the light emitting devices 320. In some cases, the pixel may correspond to a picture element including the driving circuit connected to the electrode pad 330.

The electrode pad 330 may include a first electrode pad 331 connected to first electrodes of the light emitting devices 321 to 323 and a second electrode pad 332 connected to second electrodes of the light emitting devices 321 to 323.

The first electrode pad 331 provides a common electrode, and thus at least one first electrode pad 331 may be provided. A plurality of second electrode pads 331 may be provided to provide different signals to the light emitting devices 321 to 323, respectively. In the embodiment of FIG. 11, one first electrode pad 331 is provided, and three second electrode pads 332 are provided according to the number of light emitting devices 321 to 323.

The light emitting device 320 may be the vertical type light emitting device. The light emitting device 320 may be provided on the first electrode pad 331 and connected to the second electrode pad 332 through a wire 340. Specifically, FIG. 11 shows that the red light emitting device 321 is the vertical type light emitting device.

The light emitting device 320 may be the horizontal type light emitting device. The light emitting device 320 may be connected to each of the first electrode pad 331 and the second electrode pad 332 through the wire 340. Specifically, FIG. 11 shows that each of the green light emitting device 322 and the blue light emitting device 323 is the horizontal type light emitting device.

In some cases, the pixel may include only the vertical type light emitting device, only the horizontal type light emitting device, or both the vertical type light emitting device and horizontal type light emitting device. Specifically, FIG. 11 shows that the vertical type light emitting device and horizontal type light emitting device are mixed.

The display device 300 may improve the contrast ratio by including a molding 350 in the pixel. Here, the molding 350 may have a transmittance less than 100%, that is, the molding 350 may have a certain degree of opacity. However, since the molding 350 covers the light emitting devices 321 to 323, the molding 350 needs to have a certain degree of transparency. When the molding 350 is completely opaque, light emitted from the light emitting devices 321 to 323 may not be emitted to the front surface. When the opacity is extremely high, the power consumption may increase to obtain high luminance.

Since the molding 350 requires a certain degree of transparency, the electrode pad 330 may also be exposed to the front surface across the molding 350. As the electrode pad 330 is exposed to the front surface, the contrast ratio of the display device 300 may be lowered. In contrast, when the transmittance of the molding 350 is lowered to reduce the exposure level of the electrode pads 330, the power consumption of the display device 300 may increase, and thus it may be difficult to implement high saturation and luminance.

Hereinafter, an embodiment in which a first molding 360 is added will be described to solve the above problem. The molding 350 shown in FIG. 11 is hereinafter referred to as a second molding 350.

Figure 12:
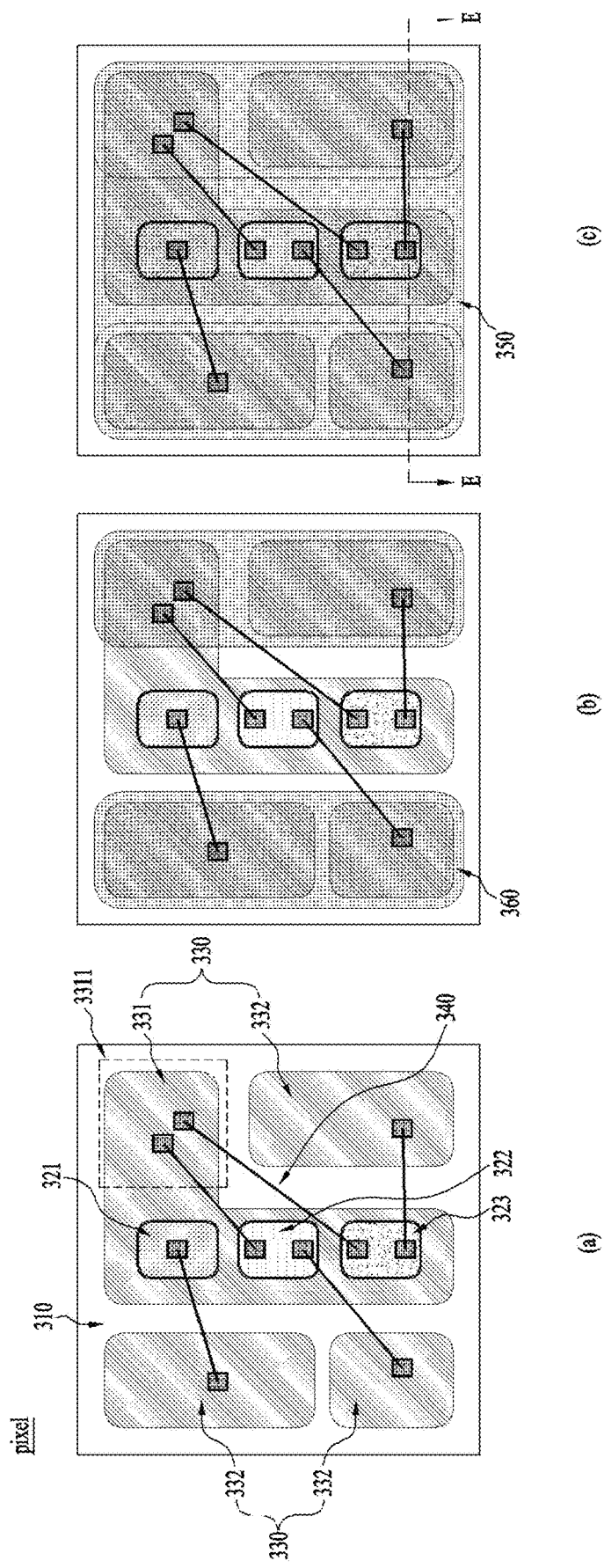
FIG. 12 is an enlarged view of a pixel including a first molding 360.

FIG. 12 is an enlarged view of the pixel including the first molding 360. The same configuration described above in FIGS. 10 and 11 will not be repeated.

The display device 300 according to an embodiment of the present disclosure may include the base substrate 310 and a pixel including a plurality of light emitting devices 320 on the base substrate 310.

The pixel may correspond to a picture element including the light emitting devices 320 and the electrode pad 330 connected to the light emitting devices 320. In some cases, the pixel may correspond to a picture element including the driving circuit connected to the electrode pad 330.

The electrode pad 330 may include the first electrode pad 331 connected to the first electrodes of the light emitting devices 321 to 323 and the second electrode pad 332 connected to the second electrodes of the light emitting devices 321 to 323. The first electrode pad 331 provides a common electrode, and thus at least one first electrode pad 331 may be provided. A plurality of second electrode pads 331 may be provided to provide different signals to the light emitting devices 321 to 323, respectively.

The light emitting device 320 may be the vertical type light emitting device. The light emitting device 320 may be provided on the first electrode pad 331 and connected to the second electrode pad 332 through the wire 340.

The light emitting device 320 may be the horizontal type light emitting device. The light emitting device 320 may be connected to each of the first electrode pad 331 and the second electrode pad 332 through the wire 340.

In some cases, the pixel may include only the vertical type light emitting device, only the horizontal type light emitting device, or both the vertical type light emitting device and horizontal type light emitting device. Specifically, FIG. 12 shows that the vertical type light emitting device and horizontal type light emitting device are mixed.

The display device 300 according to an embodiment of the present disclosure may include the first molding 360 that covers at least a part of the electrode pads 330 by avoiding an area in which the light emitting devices 321 to 323 are disposed. The second molding 350 may cover the light emitting devices 321 to 323 and the first molding 360.

Specifically, the first molding 360 may cover at least one of the first electrode pad 331 and the second electrode pad 332. In some cases, the first molding 360 may additionally cover a partial region of the first electrode pad 331 or the second electrode pad 332.

The opacity of the first molding 360 may be higher than that of the second molding 350. The second molding 350 covers the light emitting devices 321 to 323 and thus may have high transparency. The first molding 360 prevents the electrode pad 330 from being exposed beyond the second molding 350 and thus may have high opacity.

The first molding 360 and the second molding 350 are separately provided in the display device 300, thereby preventing the electrode pad 330 from being exposed to the front surface and increasing the contrast ratio. Further, the light emitting device 321 to 323 may be configured to provide high luminance and saturation at low power.

The area covered by the first molding 360 may vary according to the types of the light emitting devices 321 to 323.

Specifically, when the light emitting device 320 is the vertical type light emitting device provided on the first electrode pad 331 (red light emitting device 321 in FIG. 12), the first molding 360 may cover the second electrode pad 332 wired to the vertical type light emitting device. Since the first electrode pad 331 is covered to some extent by the light emitting device, the effect on the contrast ratio may be reduced.

When the light emitting device 320 is the horizontal type light emitting device (green light emitting device 322 or blue light emitting device 323 in FIG. 12), the first molding 360 may cover the first electrode pad 331 and the second electrode pad 332 wired to the horizontal type light emitting device. In the horizontal type light emitting device, since the electrode pad 330 does not overlap with the light emitting device, the first molding 360 may not need to cover both the first electrode pad 331 and the second electrode pad 332.

In some cases, a plurality of light emitting devices 320 may be arranged on the first electrode pad 331 and wired to a plurality of second electrode pads 332, respectively. In this case, the first molding 360 may cover all of the plurality of second electrode pads 332 provided adjacent to the first electrode pad 331.

Hereinafter, the area covered by the first molding 360 will be described in detail with reference to FIG. 12(a). The light emitting devices 321 to 323 provided on the first electrode pad 331 may include a vertical type light emitting device 321 and horizontal type light emitting devices 322 and 323. The first electrode 331 may include a contact portion 3311 extending in one direction from an area in which the light emitting devices 321 to 323 are provided in order to be wired with the horizontal type light emitting devices 322 and 323. The first molding 360 may cover the contact portion 3311 of the first electrode pad 331 and the second electrode pad 332.

Specifically, the first electrode pad 331 may be provided along a direction in which the light emitting devices 321 to 323 are arranged, and a plurality of second electrode pad 332 may be provided on both sides of the first electrode pad 331. The contact portion 3311 is an area where the second electrode pad 332 is not provided and may be extended in a lateral direction of the first electrode pad 331. In this case, the first molding 360 may be provided to cover both side regions of the first electrode pad 331 as shown in FIG. 12(b). It may be seen from FIG. 12(c) that when the second molding 350 is covered by the first molding 360, the area where the electrode pad 330 is exposed beyond the second molding 350 decreases compared to FIG. 11(b).

Figure 13:
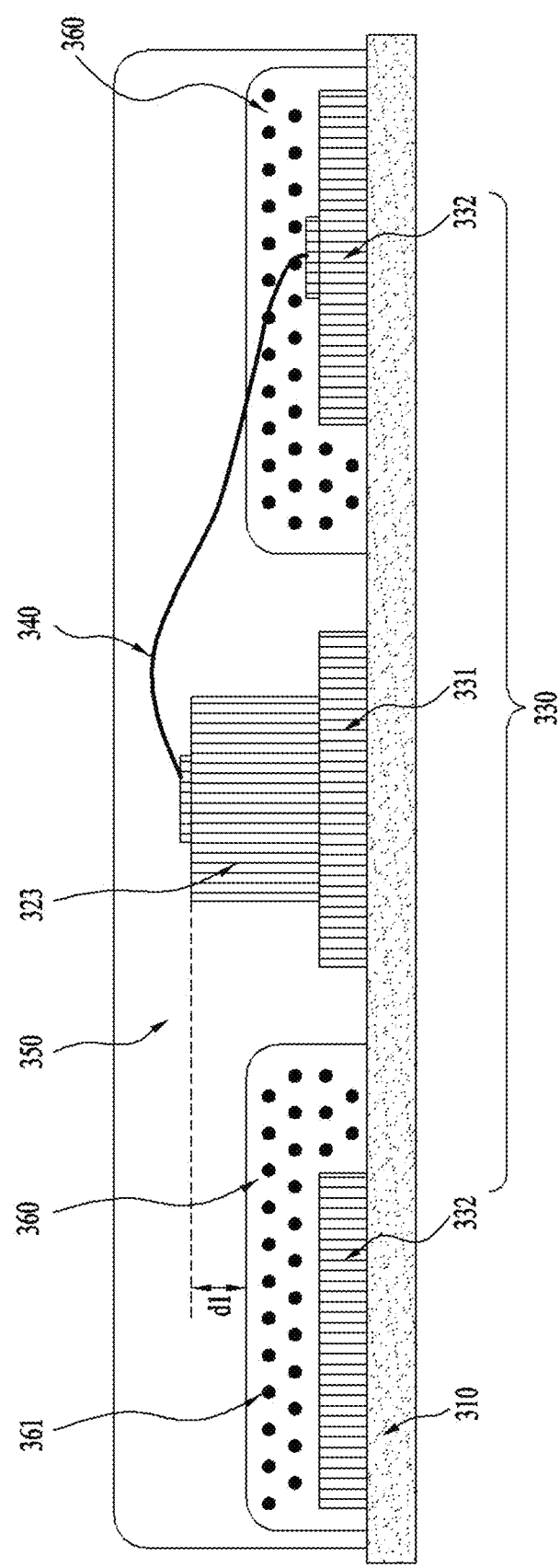
FIG. 13 is a cross-sectional view taken along line E-E' of FIG. 12.

FIG. 13 is a cross-sectional view taken along line E-E' of FIG. 12. The same configuration described above in FIG. 12 will not be repeated.

The display device 300 may include the light emitting device 323 on the base substrate 310. Each electrode of the light emitting device 323 may be connected to the first electrode pad 331 and the second electrode pad 332. The light emitting device 323 may be connected to at least one of the first electrode pad 331 and the second electrode pad 332 through the wire 340. The first molding 360 may cover at least one of the first electrode pad 331 and the second electrode pad 332, and the second molding 350 may cover the first molding 360 and the light emitting device 323.

The opacity of the first molding 360 may be higher than that of the second molding 350. Specifically, the first molding 360 may include a predetermined amount of black powder 361. The first molding 360 may be made of a silicon material and inserted into the electrode pad 330 in an inkjet method. In this case, the amount of the black powder 361 may determine the viscosity and brightness of the first molding 360. Specifically, as the amount of the black powder 361 increases, the brightness of the first molding 360 may be darker and the viscosity may increase.

The first molding 360 may be more opaque than the second molding 350. Considering that the first molding 360 is provided on both sides of the light emitting device 323, the front surface of the first molding 360 may be positioned lower than the front surface of the light emitting device 323 to form a step difference between the front surface of the first molding 360 and the front surface of the light emitting device 323. When the front surface of the first molding 360 is positioned higher than the front surface of the light emitting device 323, the light emission angle of the light emitting device 323 may be narrowed. Specifically, FIG. 13 shows that the front surface of the first molding 360 is lower than the front surface of the light emitting device 323 by d1.

The amount of the black powder 361 included in the first molding 360 may be determined according to the height of the front surface of the light emitting device 323. The amount of the black powder 361 included in the first molding 360 may increase until the highest point thereof does not exceed that of the light emitting device 323 in a state that the first molding 360 is injected into the electrode pad 330. Specifically, if the amount of the black powder 361 increases, the contrast ratio may increase, but the viscosity may also increase so that the highest point is higher than that of the light emitting device 323. This may be disadvantageous in terms of the display thickness and the light emission angle of the light emitting device 323.

The second molding 350 may also have a certain degree of opacity. However, the transparency of the second molding 350 should be higher than that of the first molding 360. Accordingly, the amount of the black powder 361 included in the second molding 350 may be lower than that included in the first molding 360.

Figure 14:
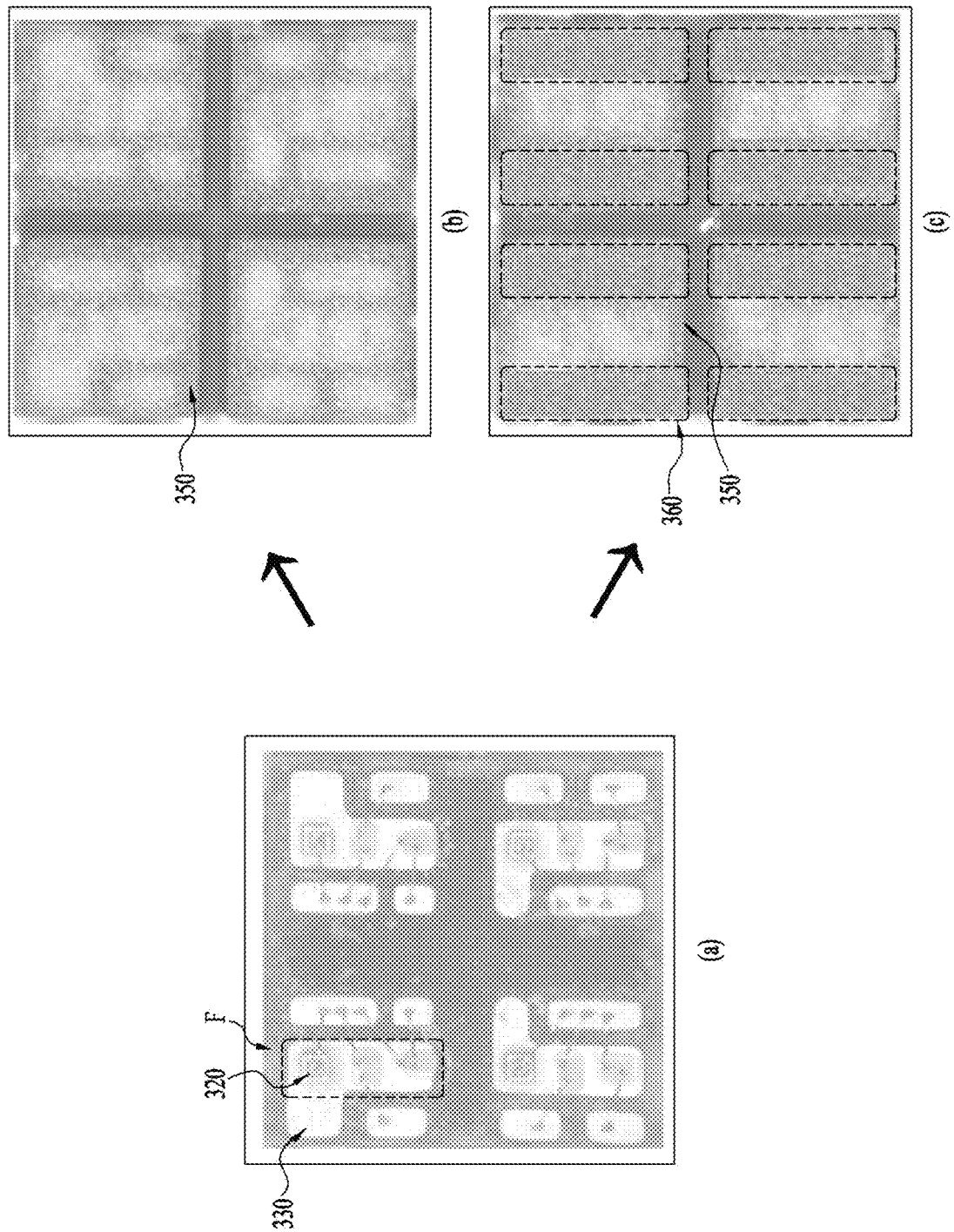
FIG. 14 is a view for comparing how much an electrode pad 330 is exposed to a front surface when the first molding 360 is covered or not.

FIG. 14 is a view for comparing how much the electrode pad 330 is exposed to the front surface when the first molding 360 is covered or not. Specifically, FIG. 14(a) shows a case in which the first molding 360 and the second molding 350 are not present, FIG. 14(b) shows a case in which only the second molding 350 is covered, and FIG. 14(c) shows a case in which both the first molding 360 and the second molding 350 are covered.

Referring to FIG. 14(b), it may be seen that when only the second molding 350 is covered, the electrode pad 330 is considerably exposed to the front surface.

Referring to FIG. 14(c), it may be seen that when the first molding 360 is additionally covered, the exposure level of the electrode pad 330 is significantly reduced. This may act as a factor for improving the contrast ratio.

However, it may also be seen in FIG. 14(c) that the electrode pad 330 is exposed to an area F in which the light emitting device 320 is provided. Hereinafter, an embodiment for preventing the electrode pad 330 from being exposed to the area F in which the light emitting device 320 is provided will be described.

Figure 15:
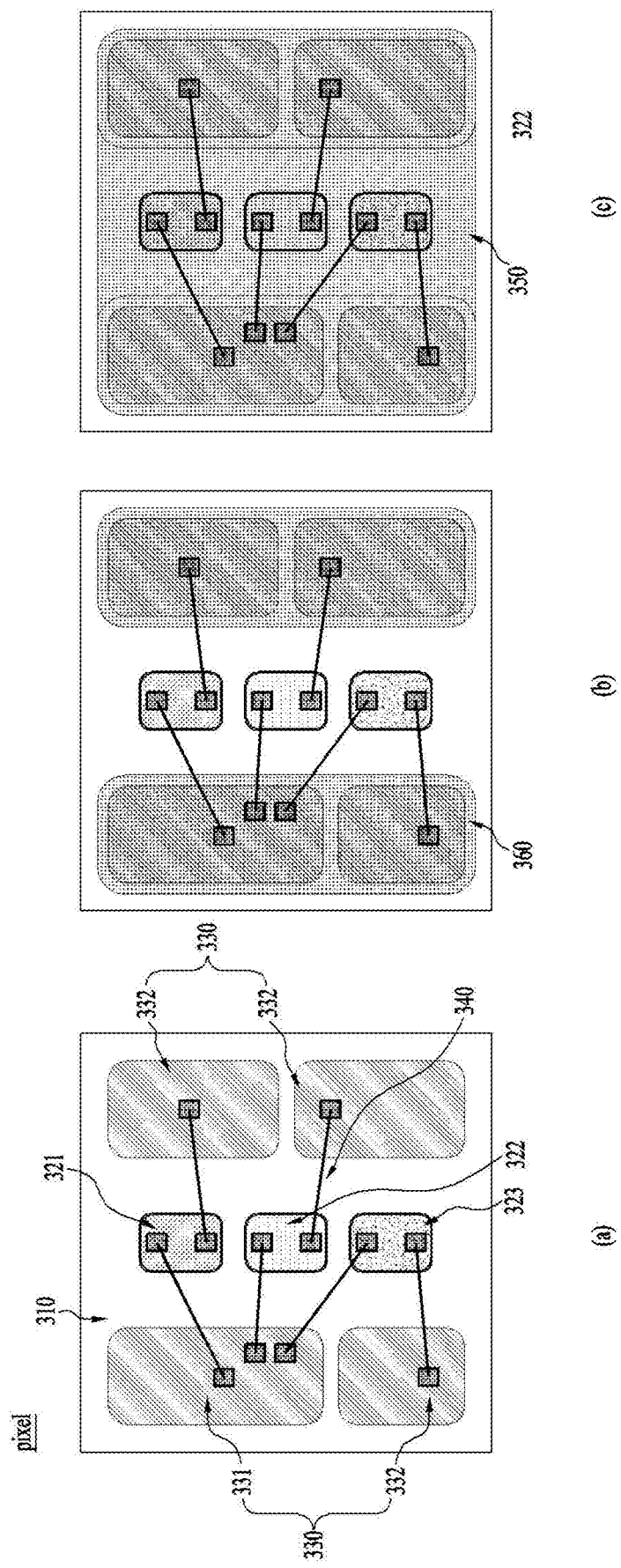
FIG. 15 illustrates an embodiment of a pixel structure.

FIG. 15 shows an embodiment of a pixel structure. The same configuration described above in FIG. 12 will not be repeated.

The display device 300 according to an embodiment of the present disclosure may include the base substrate 310 and a pixel including a plurality of light emitting devices 320 on the base substrate 310.

The pixel may correspond to a picture element including the light emitting devices 320 and the electrode pad 330 connected to the light emitting devices 320. In some cases, the pixel may correspond to a picture element including the driving circuit connected to the electrode pad 330.

The electrode pad 330 may include the first electrode pad 331 connected to the first electrodes of the light emitting devices 321 to 323 and the second electrode pad 332 connected to the second electrodes of the light emitting devices 321 to 323. The first electrode pad 331 provides a common electrode, and thus at least one first electrode pad 331 may be provided. A plurality of second electrode pads 331 may be provided to provide different signals to the light emitting devices 321 to 323, respectively.

Here, each of the plurality of light emitting devices 321 to 323 may the horizontal type light emitting device. Specifically, each of the plurality of light emitting devices 321 to 323 may be connected to the first electrode pad 331 and the second electrode pad 332 through the wire 340.

The plurality of light emitting devices 321 to 323 may be arranged in one direction. The first electrode pad 331 and the second electrode pad 332 may be provided along both sides perpendicular to the direction in which the light emitting device 320 is arranged. One first electrode pad 331 may be provided as a common electrode, and a plurality of second electrode pads 332 may be provided according to the number of light emitting devices. Specifically, FIG. 15(*a*) shows that one first electrode pad 331 and three second electrode pads 332 are bisected and arranged on both sides of a plurality of light emitting devices 320.

In this case, since the light emitting devices 321 to 323 do not overlap with the electrode pad 330, the first molding 360 may cover the entirety of the electrode pad 330. When the second molding 350 is covered, it is possible to completely prevent the electrode pad 330 from being exposed over the second molding 360 (that is, it is possible to prevent the electrode pad 330 from being exposed across the second molding 360 in the area F in which the light emitting device is provided as shown in FIG. 14).

However, for the light emitting devices 321 to 323, it may be more efficient to mix the vertical and horizontal types depending on emission colors. Hereinafter, an embodiment in which the vertical and horizontal types are mixed in configuring the light emitting devices 321 to 323 will be described.

Figure 16:
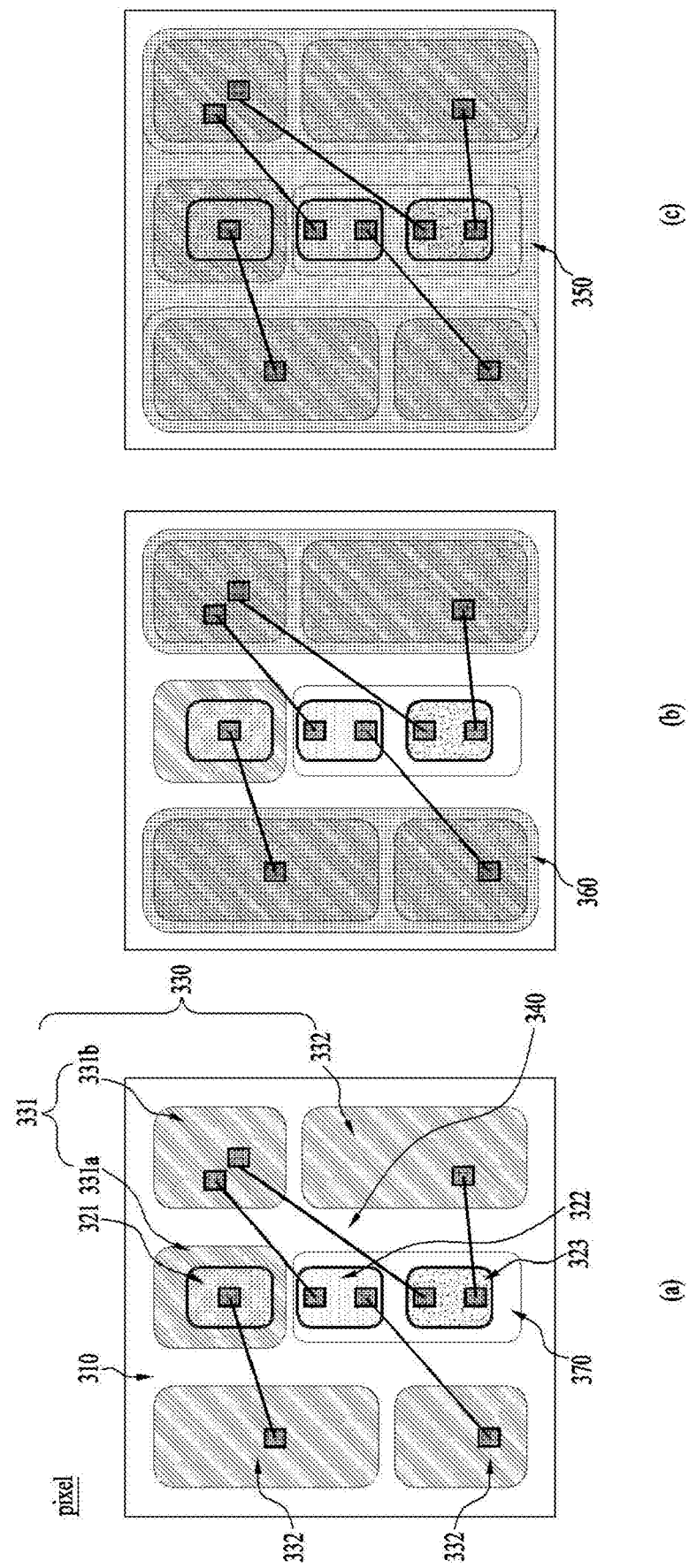
FIG. 16 illustrates another embodiment of the pixel structure.

FIG. 16 illustrates another embodiment of the pixel structure. The same configuration described above in FIG. 12 will not be repeated.

The display device 300 according to an embodiment of the present disclosure may include the base substrate 310 and a pixel including a plurality of light emitting devices 320 on the base substrate 310.

The pixel may correspond to a picture element including the light emitting devices 320 and the electrode pad 330 connected to the light emitting devices 320. In some cases, the pixel may correspond to a picture element including the driving circuit connected to the electrode pad 330.

The electrode pad 330 may include the first electrode pad 331 connected to the first electrodes of the light emitting devices 321 to 323 and the second electrode pad 332 connected to the second electrodes of the light emitting devices 321 to 323. The first electrode pad 331 provides a common electrode, and thus at least one first electrode pad 331 may be provided. A plurality of second electrode pads 331 may be provided to provide different signals to the light emitting devices 321 to 323, respectively.

The plurality of light emitting devices 321 to 323 may be configured by mixing the vertical type light emitting device and the horizontal type light emitting device. Specifically, FIG. 16(*a*) shows that the red light emitting device 321 is the vertical type light emitting device and each of the green light emitting device 322 and the blue light emitting device 323 is the horizontal type light emitting device.

The electrode pad 330 may include the first electrode pad 331 for providing a common electrode to the light emitting devices 321 to 323 and the second electrode pad 332 for providing different signals to the light emitting devices 321 to 323, respectively.

The first electrode pad 331 may include an unexposed first electrode pad 331*a* and an exposed first electrode pad 331*b*. The unexposed first electrode pad 331*a* may overlap with the vertical type light emitting device 321, and be connected to the first electrode of the vertical type light emitting device 321. The exposed first electrode pad 331*b* may be provided by avoiding an area in which the light emitting devices 321 to 323 are provided, and connected to the first electrodes of the horizontal type light emitting devices 322 and 323.

In this case, since the horizontal type light emitting devices 322 and 323 are not provided on the electrode pad 330, the horizontal type light emitting devices 322 and 323 may not overlap with the electrode pad 330. The first molding 360 may cover the exposed first electrode pad 331*b* and the second electrode pad 332 to prevent being exposed to the front surface beyond the second molding 350. That is, it is possible to minimize the exposure of the first electrode pad 331 beyond the second molding 350 in the area in which the light emitting devices 321 to 323 are provided.

In some cases, the horizontal type light emitting devices 322 and 323 may be provided on a support member 370 having the same height as the first electrode pad 331. In this case, the support member 370 may be provided in black. The support member 370 may serve to match the height of the horizontal type light emitting devices 322 and 323 with the vertical type.

Figure 17:
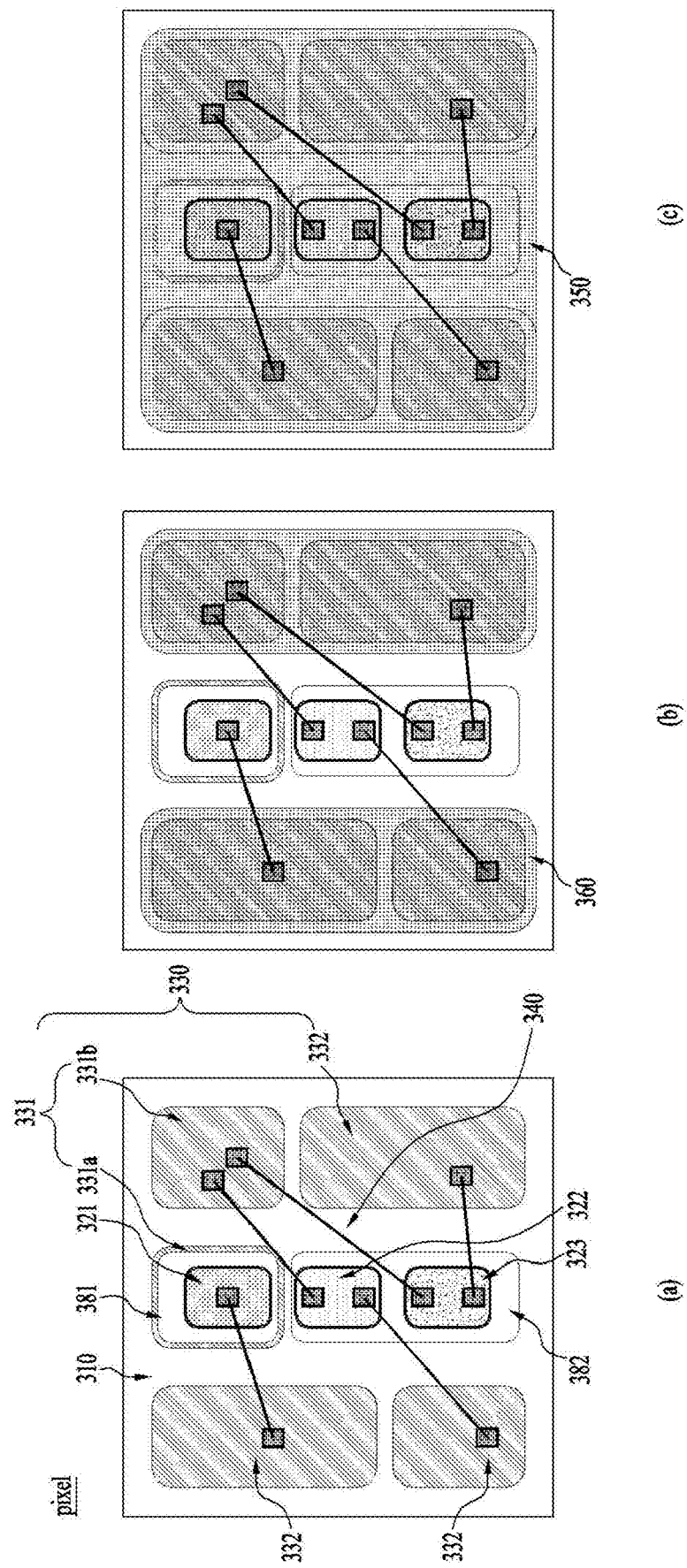
FIG. 17 illustrates a further embodiment of the pixel structure.

FIG. 17 illustrates a further embodiment of the pixel structure. The same configuration described above in FIG. 12 will not be repeated.

The display device 300 according to an embodiment of the present disclosure may include the base substrate 310 and a pixel including a plurality of light emitting devices 320 on the base substrate 310.

The pixel may correspond to a picture element including the light emitting devices 320 and the electrode pad 330 connected to the light emitting devices 320. In some cases, the pixel may correspond to a picture element including the driving circuit connected to the electrode pad 330.

The plurality of light emitting devices 321 to 323 may be configured by mixing the vertical type light emitting device and the horizontal type light emitting device. Specifically, FIG. 17(*a*) shows that the red light emitting device 321 is the vertical type light emitting device and each of the green light emitting device 322 and the blue light emitting device 323 is the horizontal type light emitting device.

The electrode pad 330 may include the first electrode pad 331 for providing a common electrode to the light emitting devices 321 to 323 and the second electrode pad 332 for providing different signals to the light emitting devices 321 to 323, respectively.

The first electrode pad 331 may include the unexposed first electrode pad 331*a* and the exposed first electrode pad 331*b*. The unexposed first electrode pad 331*a* may overlap with the vertical type light emitting device 321, and be connected to the first electrode of the vertical type light emitting device 321. The exposed first electrode pad 331*b* may be provided by avoiding an area in which the light emitting devices 321 to 323 are provided, and connected to the first electrodes of the horizontal type light emitting devices 322 and 323.

In this case, since the horizontal type light emitting devices 322 and 323 are not provided on the electrode pad 330, the horizontal type light emitting devices 322 and 323 may not overlap with the electrode pad 330. The first molding 360 may cover the exposed first electrode pad 331*b* and the second electrode pad 332 to prevent being exposed to the front surface beyond the second molding 350. That is, it is possible to minimize the exposure of the first electrode pad 331 beyond the second molding 350 in the area in which the light emitting devices 321 to 323 are provided.

The vertical type light emitting device 321 may be fixed to the first electrode pad 331 by a first adhesive 381. Here, the first adhesive 381 may be an ACF. The first adhesive 381 may have high opacity. Specifically, the horizontal type light emitting devices 322 and 323 may be fixed to the base substrate 310 by a second adhesive 382. In this case, the opacity of the first adhesive 381 may be higher than that of the second adhesive 382.

A portion of the first electrode pad 331 that is not covered by the first molding 360 may be covered by the first adhesive 381 to prevent being exposed to the front surface beyond the second molding 350.

Hereinafter, a structure of the electrode pad 300 suitable for covering the first molding 360 will be described.

Figure 18:
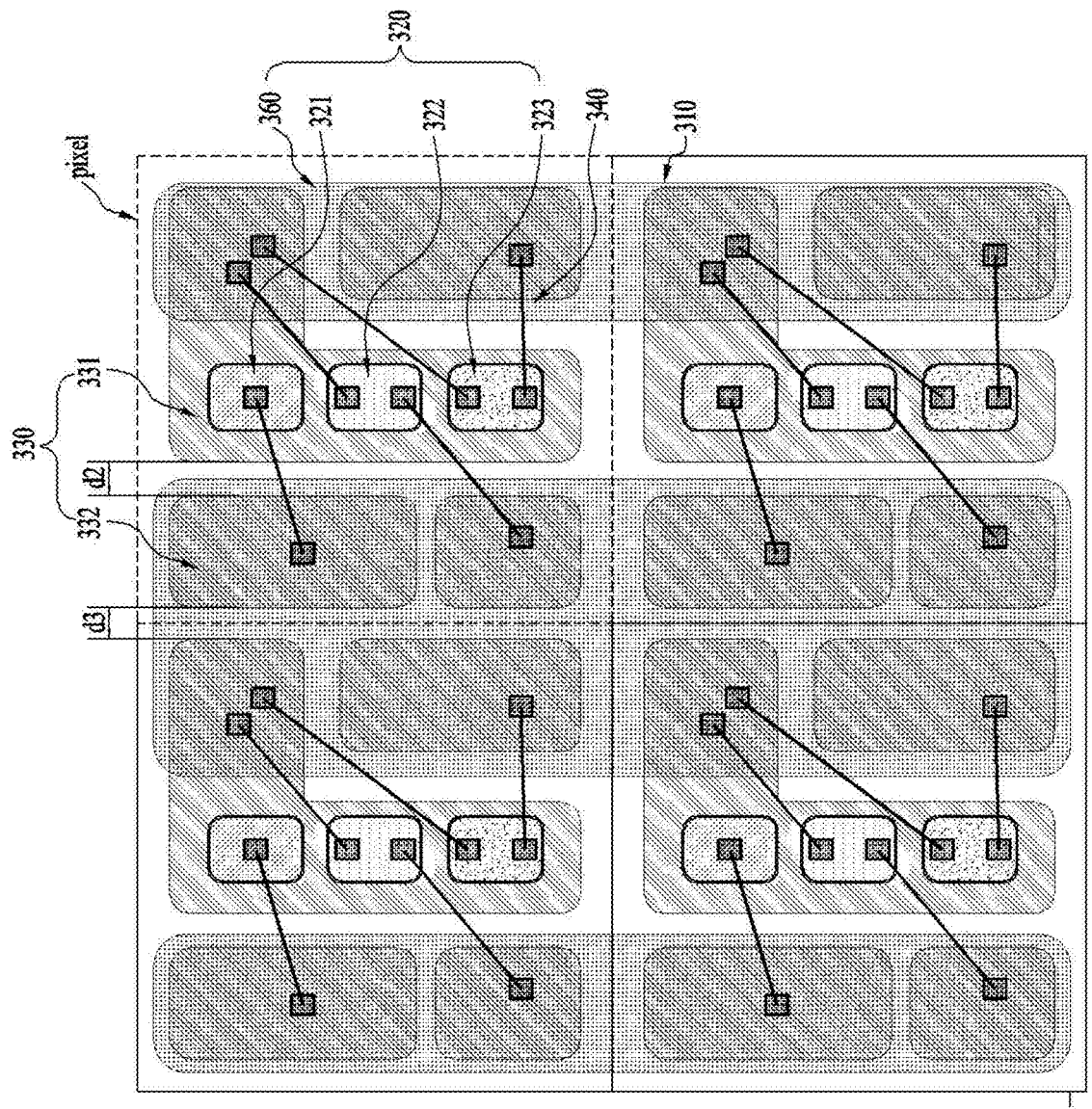
FIG. 18 is a conceptual view illustrating a spacing between electrode panels of pixels.

FIG. 18 is a conceptual view illustrating a spacing between electrode panels of pixels. The same configuration described above in FIG. 12 will not be repeated.

The display device 300 according to an embodiment of the present disclosure may include the base substrate 310 and a pixel including a plurality of light emitting devices 320 on the base substrate 310.

The pixel may correspond to a picture element including the light emitting devices 320 and the electrode pad 330 connected to the light emitting devices 320. In some cases, the pixel may correspond to a picture element including the driving circuit connected to the electrode pad 330.

The electrode pad 330 may include the first electrode pad 331 connected to the first electrodes of the light emitting devices 321 to 323 and the second electrode pad 332 connected to the second electrodes of the light emitting devices 321 to 323. The first electrode pad 331 provides a common electrode, and thus at least one first electrode pad 331 may be provided. A plurality of second electrode pads 331 may be provided to provide different signals to the light emitting devices 321 to 323, respectively.

The light emitting device 320 may be the vertical type light emitting device. The light emitting device 320 may be provided on the first electrode pad 331 and connected to the second electrode pad 332 through the wire 340.

The light emitting device 320 may be the horizontal type light emitting device. The light emitting device 320 may be connected to each of the first electrode pad 331 and the second electrode pad 332 through the wire 340.

In some cases, the pixel may include only the vertical type light emitting device, only the horizontal type light emitting device, or both the vertical type light emitting device and horizontal type light emitting device. Specifically, FIG. 18 shows that the vertical type light emitting device and horizontal type light emitting device are mixed.

The base substrate 310 may include a plurality of pixels, and each pixel unit may include the plurality of light emitting devices 320 and the electrode pads 330. Specifically, the pixel may include the first electrode pad 331 at a location in which the light emitting devices 320 are arranged, and the second electrode pad 332 may be provided on both sides of the first electrode pad 331.

In this case, a second electrode pad 332 in one pixel may be provided on the base substrate 310 such that the second electrode pad 332 is closer to another second electrode pad 332 in an adjacent pixel than the first electrode pad 331 in the corresponding pixel. Specifically, a distance d1 between first and second electrode pad 331 and 332 in one pixel may be greater than a distance d2 between second electrode pads 332 in adjacent pixels.

Such a structure may be advantageous for the first molding 360 to cover the second electrode pad 332 at once. In addition, the structure may also be advantageous to prevent invasion of the light emitting device 320 while the first molding 360 is covered.

The above description is merely illustrative of the technical spirit of the present disclosure. It will be understood by those of ordinary skill in the technical field to which the present disclosure pertains can make various modifications and variations without departing from the essential characteristics of the present disclosure.

The embodiments disclosed in the present disclosure should not be construed to limit the technical spirit of the present disclosure, but should be construed to illustrate the technical spirit of the present disclosure. In addition, the scope of the technical spirit of the present disclosure is not limited by the embodiments.

The scope of the present disclosure should be interpreted based on the following appended claims. Accordingly, the present disclosure should be construed to cover all modifications or variations induced from the meaning and scope of the appended claims and their equivalents.

What is claimed is:

1. A display device comprising:
   a base substrate having an electrode pad on a front surface thereof a light emitting device provided on the base substrate and connected to the electrode pad;
   a first molding configured to cover at least a part of the electrode pad by avoiding an area in which the light emitting device is provided; and
   a second molding configured to cover the light emitting device and the first molding,
   wherein the electrode pad comprises:
      a first electrode pad connected to a first electrode of the light emitting device; and
      a second electrode pad connected to a second electrode of the light emitting device,
   wherein the light emitting device comprises a vertical type light emitting device and a horizontal type light emitting device,
   wherein the first electrode pad comprises:
      an unexposed first electrode pad overlapping with the vertical type light emitting device and connected to a first electrode of the vertical type light emitting device; and
      an exposed first electrode pad provided by avoiding an area in which the light emitting device is provided and connected to a first electrode of the horizontal type light emitting device, and
   wherein the first molding is configured to cover the exposed first electrode pad and one or more second electrode pads, each of which is wired to the light emitting device.

2. The display device of claim 1, wherein a plurality of light emitting devices are arranged on the first electrode pad and wired to a plurality of second electrode pads adjacent thereto, respectively, and wherein the first molding is configured to cover the plurality of second electrode pads provided adjacent to the first electrode pad.

3. The display device of claim 2,
   wherein the first electrode pad comprises a contact portion to be wired to the horizontal type light emitting device, wherein the contact portion extends in one direction in an area in which the light emitting devices are provided, and
   wherein the first molding is configured to cover the contact portion of the first electrode pad.

4. The display device of claim 2, wherein the electrode pad and the plurality of light emitting devices are provided for each pixel unit, and wherein the second electrode pad provided in one pixel unit is positioned to be closer to the second electrode pad in another adjacent pixel unit than the first electrode pad in the corresponding pixel unit.

5. The display device of claim 1, wherein the vertical type light emitting device is fixed to the unexposed first electrode pad by a first adhesive,
   wherein the horizontal type light emitting device is fixed to the base substrate by a second adhesive, and wherein opacity of the first adhesive is higher than opacity of the second adhesive.

6. The display device of claim 1, further comprising a support member provided on the base substrate, overlapping with the horizontal type light emitting device, and having a thickness corresponding to the unexposed first electrode pad.

7. The display device of claim 1, wherein the first molding is more opaque than the second molding.

8. The display device of claim 7, wherein the first molding has a front surface forming a step difference with a front surface of the light emitting device, and wherein the front surface of the first molding is positioned lower than the front surface of the light emitting device.

9. The display device of claim 8, wherein the first molding is made of silicon, and wherein the first molding contains a predetermined amount of black powder determining viscosity and brightness of the first molding.

10. The display device of claim 9, wherein the predetermined amount is a maximum amount forming a highest point lower than the light emitting device when the first molding is injected into the electrode pad.

11. The display device of claim 9, wherein the second molding contains a less amount of black powder than the first molding.

\* \* \* \* \*